US012669584B2

(12) United States Patent (10) Patent No.: US 12,669,584 B2

Kobayashi et al. (45) Date of Patent: Jun. 30, 2026

(54) OPTICAL MODULE AND DISTANCE MEASURING APPARATUS

(71) Applicant: SONY SEMICONDUCTOR SOLUTIONS CORPORATION, Kanagawa (JP)

(72) Inventors: Takashi Kobayashi, Kanagawa (JP); Motoi Kimura, Kanagawa (JP); Tatsuya Oiwa, Kanagawa (JP); Jialun Xu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 840 days.

(21) Appl. No.: 17/997,936

(22) PCT Filed: Mar. 19, 2021

(86) PCT No.: PCT/JP2021/011412

§ 371 (c)(1),
(2) Date: Nov. 4, 2022

(87) PCT Pub. No.: WO2021/229918

PCT Pub. Date: Nov. 18, 2021

(65) Prior Publication Data

US 2023/0168346 A1 Jun. 1, 2023

(30) Foreign Application Priority Data

May 15, 2020 (JP) .................................. 2020-086159

(51) Int. Cl.
*G01S 7/481* (2006.01)
*G01S 17/08* (2006.01)
(Continued)

(52) U.S. Cl.
CPC ............. *G01S 7/4811* (2013.01); *G01S 17/08* (2013.01); *G02B 3/06* (2013.01); *G02B 5/1866* (2013.01);
(Continued)

(58) Field of Classification Search
USPC ....................................................... 356/4.01
See application file for complete search history.

(56) References Cited

U.S. PATENT DOCUMENTS 9,810,775 B1 * 11/2017 Welford .................. G01S 17/10
2011/0255172 A1 * 10/2011 Tanaka ................ H10P 14/3454
257/E21.328
(Continued)

FOREIGN PATENT DOCUMENTS

CN 110822322 A 2/2020
JP 10-161008 A 6/1998
(Continued)

OTHER PUBLICATIONS

International Search Report and Written Opinion of PCT Application No. PCT/JP2021/011412, issued on May 11, 2021, 11 pages of ISRWO.

*Primary Examiner* — Yuqing Xiao
*Assistant Examiner* — Clint Thatcher
(74) *Attorney, Agent, or Firm* — CHIP LAW GROUP

(57) ABSTRACT

In an optical module that irradiates an object with a light beam and detects reflected light thereof, a linear light beam without distortion is emitted regardless of an incident angle of a scanned light beam.

The light emitting unit includes a plurality of light emitting elements arranged in a predetermined direction. The converging unit converges the light beam emitted from each of the plurality of light emitting elements into a substantially parallel light beam or a light beam having a predetermined
(Continued)

angular width at a predetermined diaphragm center point. The light conversion unit converts the light beam through the converging unit into a linear light beam in a line direction substantially orthogonal to the arrangement direction of the light emitting unit by the optical surface. The light detection unit detects reflected light from the object with respect to the linear light beam. In the optical surface of the light conversion unit, the curvature radius in the arrangement direction of the light emitting unit is substantially equal to the distance from the virtual diaphragm center point in the arrangement direction of the light emitting unit to the center point of the optical surface of the light conversion unit regardless of the position in the line direction.

19 Claims, 27 Drawing Sheets

(51) Int. Cl.

| | | |
|---|---|---|
| *G02B 3/06* | (2006.01) |
| *G02B 5/18* | (2006.01) |
| *G02B 19/00* | (2006.01) |
| *G02B 27/30* | (2006.01) |
| *H01S 5/183* | (2006.01) |

(52) U.S. Cl.

CPC ......... *G02B 19/0076* (2013.01); *G02B 27/30* (2013.01); *H01S 5/18388* (2013.01); *G01S 7/4817* (2013.01)

(56) References Cited

U.S. PATENT DOCUMENTS

| | | | | |
|---|---|---|---|---|
| 2015/0085075 A1* | 3/2015 | Hudman | ................ H04N 23/20 |
| | | | 348/46 |
| 2017/0160130 A1* | 6/2017 | Morino | ................ G02B 6/3624 |
| 2018/0329218 A1 | 11/2018 | Sun et al. | |
| 2019/0041659 A1* | 2/2019 | Chern | .................. G02B 27/425 |
| 2019/0293948 A1* | 9/2019 | Ramthun | ........... G02B 27/0966 |
| 2020/0363197 A1* | 11/2020 | Sato | ......................... G01C 3/06 |

FOREIGN PATENT DOCUMENTS

| | | | |
|---|---|---|---|
| JP | 10-239023 | A | 9/1998 |
| JP | 3082587 | U | 12/2001 |
| JP | 2002-039716 | A | 2/2002 |
| JP | 2006-116028 | A | 5/2006 |
| JP | 2007-213877 | A | 8/2007 |
| JP | 2017-079173 | A | 4/2017 |

* cited by examiner

LIGHT RECEIVING UNIT 181

PHOTODETECTOR 180

182

SCANNING DIRECTION

DIFFUSION PLATE 163

ARRANGEMENT
DIRECTION
= SCANNING DIRECTION

LINE DIRECTION

OPTICAL MODULE AND DISTANCE MEASURING APPARATUS

CROSS REFERENCE TO RELATED APPLICATIONS

This application is a U.S. National Phase of International Patent Application No. PCT/JP2021/011412 filed on Mar. 19, 2021, which claims priority benefit of Japanese Patent Application No. JP 2020-086159 filed in the Japan Patent Office on May 15, 2020. Each of the above-referenced applications is hereby incorporated herein by reference in its entirety.

TECHNICAL FIELD

The present technology relates to an optical module. Specifically, the present technology relates to an optical module that irradiates an object with a light beam, and a distance measuring apparatus that utilizes the optical module.

BACKGROUND ART

An optical module that irradiates an object with a light beam is utilized for measuring a distance by measuring time of flight (ToF) of light, shape recognition of an object, and the like. As such an optical module, one that scans a light beam and detects reflected light from an object corresponding to each scanning position is known. For example, an apparatus using slit light as scanning light has been proposed (See, for example, Patent Document 1.).

CITATION LIST

Patent Document

Patent Document 1: Japanese Patent Application Laid-Open No. 2002-039716

SUMMARY OF THE INVENTION

Problems to be Solved by the Invention

In the above-described conventional technology, as compared with the case of irradiating the entire measuring target area, the light output of the light emitting unit can be reduced, and the generation of noise due to external light can be suppressed. However, in this conventional technology, a cylindrical lens is used to generate slit light (linear light beam), and when a scanned light beam is incident, a phenomenon occurs in which the linear light beam is distorted from a straight line to a curved line as the incident angle deviates from vertical incidence. In a case where the light beam is distorted from the straight line, it is difficult to detect the reflected light from the object corresponding to a certain scanning position in one row of the two-dimensionally arranged light receiving units. Specifically, at the end of the light receiving units in one row, the position of the reflected light is shifted, the amount of light that can be detected decreases, and the distance accuracy decreases. On the other hand, in a case where detection is performed in a plurality of rows, the detection is easily affected by noise due to external light. Moreover, in a case where the width of the linear light beam is increased, it is necessary to increase the light output of the light emitting unit, accordingly, and the power consumption increases. Furthermore, there is a case where the light output cannot be increased due to safety regulations for eyes.

The present technology has been made in view of such a situation, and an object thereof is to irradiate an object with a linear light beam without distortion regardless of an incident angle of a scanned light beam in an optical module that irradiates the object with the light beam and detects the reflected light.

Solutions to Problems

The present technology has been made to solve the above-described problems, and a first aspect of the present technology is an optical module and a distance measuring apparatus which include: a light emitting unit including a plurality of light emitting elements arranged in a predetermined direction; a converging unit configured to converge a light beam emitted from each of the plurality of light emitting elements into a substantially parallel light beam or a light beam having a predetermined angular width at a predetermined diaphragm center point; a light conversion unit configured to convert the light beam via the converging unit into a linear light beam in a line direction substantially orthogonal to the arrangement direction of the light emitting unit by an optical surface; and a light detection unit configured to detect reflected light from an object with respect to the linear light beam, in which the optical surface of the light conversion unit includes a curvature radius in the arrangement direction being substantially equal to a distance from a virtual diaphragm center point in the arrangement direction to a center point of the optical surface regardless of a position in the line direction. This brings about an effect of emitting a linear light beam without distortion.

Furthermore, in the first aspect, the light conversion unit may generate the linear light beam in accordance with a curvature radius in the line direction. This brings about an effect of generating a linear light beam orthogonal to the scanned light beam.

Furthermore, in the first aspect, the optical surface of the light conversion unit may have a shape rotated about a position separated by a curvature radius of the arrangement direction from a Z position on a surface of X=0 in the optical surface along a Z axis orthogonal to an X axis indicating the arrangement direction and a Y axis indicating the line direction, with an axis parallel to the Y axis. This brings about an effect that the light beam is made incident at an angle orthogonal to the direction vertical to the optical surface.

Furthermore, in the first aspect, the optical surface may satisfy the following conditional expression. There is an effect that the light beam is incident on the optical surface at an angle orthogonal to the vertical direction to emit a linear light beam without distortion.

$$z = (y^2/ry)/(1+(1-(1+k)\cdot y^2/ry^2)^{1/2})$$

$$+A\cdot y^4 + B\cdot y^6 + C\cdot y^8 + \ldots.$$

$$+(x^2/rx)/(1+(1-x^2/rx^2)^{1/2})$$

Herein, x, y, and z are coordinates on the X axis, the Y axis, and the Z axis, respectively, k is a conic constant, A, B, and C are fourth, sixth, and eighth aspheric coefficients, respectively, rx is a curvature radius in the arrangement direction, and ry is a curvature radius in the line direction.

Furthermore, in the first aspect, the light conversion unit may be any of an optical lens, a diffraction grating having a serration-shaped grating with respect to the arrangement direction, or a diffusion plate curved with respect to the arrangement direction.

Moreover, in the first aspect, the light emitting unit may be a surface emitting semiconductor laser in which the plurality of light emitting elements is two-dimensionally arranged.

In addition, in the first aspect, the light detection unit may include a plurality of light receiving units, and only one of the plurality of light receiving units that detects reflected light from an object in accordance with an arrangement position in the light emitting unit may be selectively operated. This brings about an effect of blocking reception of unnecessary light and reducing noise associated with the unnecessary light.

Furthermore, in the first aspect, the converging unit may include a collimator lens. In addition, the converging unit may include a cylindrical lens, and in this case, the converging unit may further include a microcylindrical lens arranged on an upper surface closest to the light emitting unit.

Moreover, in the first aspect, in the light emitting unit, the plurality of light emitting elements may be one-dimensionally arranged along the arrangement direction. Furthermore, in the light emitting unit, the plurality of light emitting elements may be two-dimensionally arranged along the arrangement direction and the line direction. In this case, the light emitting unit may be formed by expanding the arrangement of the two-dimensional light emitting elements outward in a barrel shape.

Furthermore, in the first aspect, the light conversion unit may be arranged on a deeper side than the virtual diaphragm center point, or may be arranged on a front side of the virtual diaphragm center point. In any case, the optical surface of the light conversion unit may have a curvature radius in the arrangement direction substantially equal to the distance from the virtual diaphragm center point in the arrangement direction to the center point of the optical surface regardless of the position in the line direction.

Furthermore, in the first aspect, a diffraction grating arranged at the virtual diaphragm center point may be further included. This brings about an effect of widening the emission angle region.

MODE FOR CARRYING OUT THE INVENTION

Hereinafter, modes for carrying out the present technology (hereinafter, referred to as embodiments) will be described. The description will be given in the following order.

1. First Embodiment (example of using optical lens as light conversion unit)
2. Second Embodiment (example of using diffraction grating as light conversion unit)
3. Third Embodiment (example of using diffusion plate as light conversion unit)
4. Fourth Embodiment (example of using microcylindrical lens and cylindrical lens as converging unit)
5. Fifth Embodiment (example of using light emitting element arranged in barrel shape as light emitting unit)
6. Sixth Embodiment (example in which light conversion unit is arranged before a diaphragm center point)
7. Modification Example (example in which diffraction grating is arranged at diaphragm center point)

1. FIRST EMBODIMENT

[Distance Measuring Apparatus]

Figure 1:
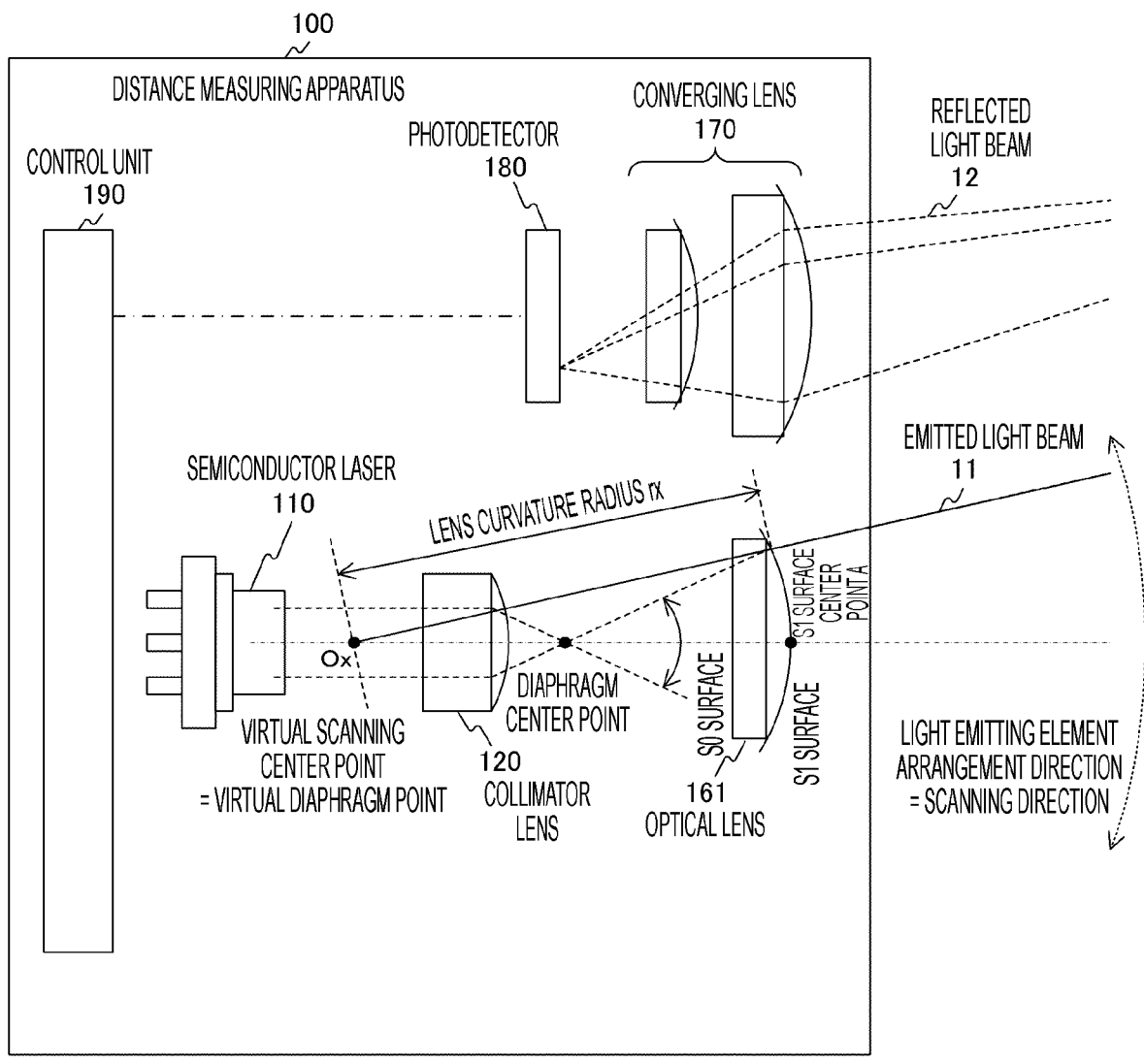
FIG. 1 is a diagram illustrating a configuration example of a distance measuring apparatus 100 according to a first embodiment of the present technology.

FIG. 1 is a diagram illustrating a configuration example of a distance measuring apparatus 100 according to a first embodiment of the present technology.

The distance measuring apparatus 100 is one example of an optical module that irradiates an object with a light beam and detects the reflected light, and is an apparatus that measures a time of flight of light and measures a distance to the object. This distance measuring apparatus 100 includes a semiconductor laser 110, a collimator lens 120, an optical lens 161, a converging lens 170, a photodetector 180, and a control unit 190.

Note that, in the following embodiment, an example of a distance measuring apparatus that measures a time of flight of light to measure a distance to an object will be described, but the present technology is not limited thereto. For example, it can also be used for a distance measuring apparatus that measures a distance by a structured light method.

The semiconductor laser 110 is a laser light source that emits a light beam. This semiconductor laser 110 may be a one-dimensionally arranged end surface emission type semiconductor laser, or may be a surface light emission type semiconductor laser (vertical cavity surface emitting laser diodes: VCSEL). Moreover, it is desirable that the semiconductor laser 110 can individually switch the light emitting elements, and can scan light by switching the light emission of the light emitting elements arranged in a predetermined direction. Furthermore, instead of performing scanning by switching light emission in order, light emission switching may be performed randomly. Note that the semiconductor laser 110 is one example of a light emitting unit described in the claims.

The collimator lens 120 is a lens that converts a light beam emitted from the semiconductor laser 110 into a substantially parallel light beam or a light beam having a predetermined angular width. It is desirable that the light beam having passed through the collimator lens 120 spreads a beam having a predetermined angular width in accordance with the distance, and irradiates the entire linear range of the target object corresponding to the range detected by one linear light receiving unit regardless of the distance. That is, this collimator lens 120 focuses the light beam emitted from the semiconductor laser 110 on a predetermined diaphragm center point. Note that the collimator lens 120 is one example of the converging unit or a light irradiation unit described in the claims.

The optical lens 161 is a lens that emits a light beam scanned by light emission switching of the semiconductor laser 110 as an emitted light beam 11. In this optical lens 161, the optical surface (S0) on the light incident side is an optical plane. The optical surface (S1) on the light emission side has different curvature radii (rx and ry) in the vertical (X) direction and the horizontal (Y) direction. The curvature in the horizontal (Y) direction has an optical surface shape for obtaining a desired horizontal field of view (HFOV). That is, the line direction in which the linear light beam is formed is the horizontal direction. The optical surface is not limited to a spherical surface, and may be a free-form surface shape or an aspherical shape. In addition, the surface shape of the optical surface (S1) may have a function of converting the incident intensity distribution of the Gaussian shape into a light beam having an intensity distribution of the top-flat shape in which the light intensity is uniformized.

The curvature radius rx in the vertical (X) direction is desirably set to be substantially equal to the length from the virtual scanning center point Ox to the optical surface on the emission side (S1) illustrated in the drawing regardless of the position in the horizontal direction. Note that the virtual scanning center point is a position of a point that gathers when the emitted light beams scanned by light emitted switching of the semiconductor laser 110 viewed from the irradiated object side are extended in the depth direction of the distance measuring apparatus 100, and is also referred to as a virtual rotation center point. Furthermore, optically, it is a virtual light emission point. Note that the virtual scanning center point is one example of a virtual diaphragm center point described in the claims.

An emitted light beam 11 from the optical lens 161 is emitted to a distance measuring object and is reflected and scattered. The reflected light from the object with respect to the emitted light beam 11 is incident on the distance measuring apparatus 100 as a reflected light beam 12. Note that the optical lens 161 is one example of a light conversion unit described in the claims.

The converging lens 170 is a lens that converges the reflected light beam 12 from the object. This reflected light beam 12 converged by the converging lens 170 is guided to the photodetector 180.

The photodetector 180 detects the reflected light beam 12 from an object. As will be described later, the photodetector 180 includes a plurality of linear light receiving units on a surface facing the converging lens 170, and detects light by sequentially enabling the linear light receiving units. Note that the photodetector 180 is one example of a light detection unit described in the claims.

The control unit 190 controls a distance measuring operation in the distance measuring apparatus 100. That is, the control unit 190 measures light emission timing of the semiconductor laser 110, a scanning position by switching light emission of the semiconductor laser 110, synchronization control of light receiving unit selection in the photodetector 180, and light detection timing. Therefore, the time of flight required for the emitted light to be reflected by the target object and detected as reflected light is measured, and the distance to the target object is measured. At that time, various techniques such as a direct technique of observing a reflected wave (direct ToF) and an indirect technique by changing a phase shift of a rectangular wave (indirect ToF) can be used. Note that the control unit 190 is one example of a measuring unit described in the claims.

Note that, in this example, the linear light beam spreading in the horizontal direction is scanned in the vertical direction by switching the light emission of the semiconductor laser 110. However, a linear light beam spreading in the vertical direction may be scanned in the horizontal direction by switching the light emission of the semiconductor laser 110.

Figure 2A:
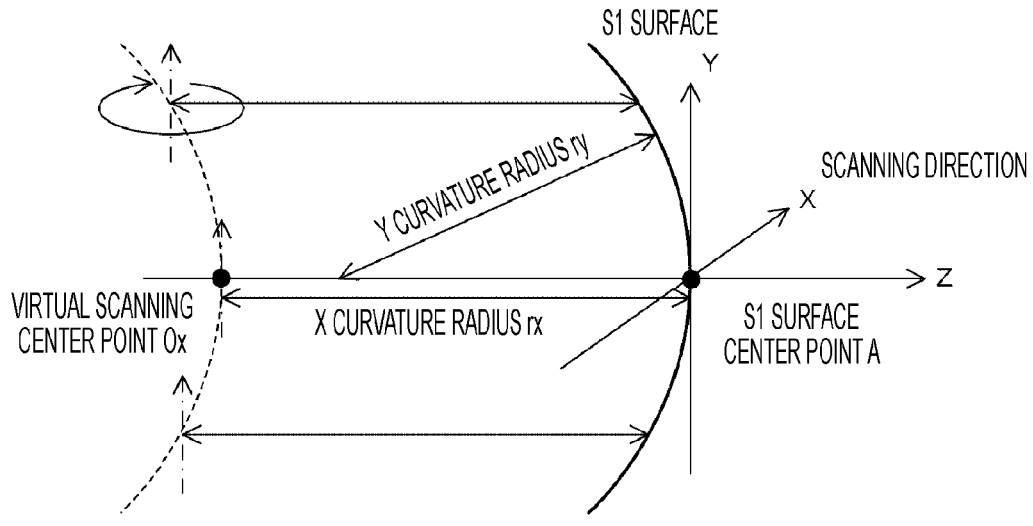
FIGS. 2A and 2B are diagrams illustrating an example of a surface shape of an optical surface (S1) of an optical lens 161 according to the first embodiment of the present technology.
Figure 2B:
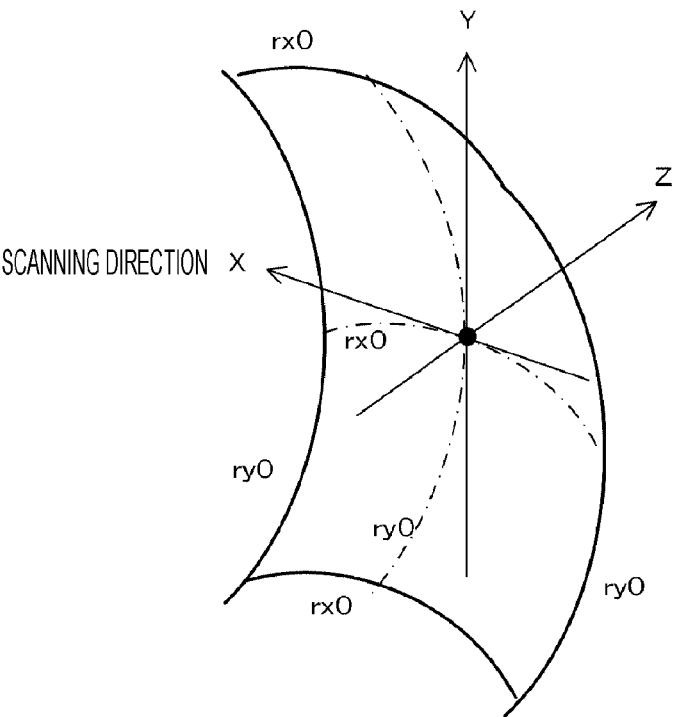

[Optical Lens] FIGS. 2A and 2B are diagrams illustrating an example of a surface shape of the optical surface (S1) of the optical lens 161 according to the first embodiment of the present technology.

As illustrated in FIG. 2A, there is a curve drawn with an arbitrary curvature radius ry centered on the Z axis in the YZ plane of X=0. A curved surface is drawn by rotating parallel to the XZ plane (i.e., about the axis parallel to the Y axis,) about a position rx away parallel to the Z axis from an arbitrary point on the curve. The curved surface drawn in this manner is an optical surface (S1) illustrated in FIG. 2B. That is, the optical surface (S1) has a shape rotated with an axis parallel to the Y axis about a position separated from the virtual scanning center point Ox by the curvature radius rx in the scanning direction along the Z axis orthogonal to the X axis indicating the scanning direction and the Y axis indicating the line direction.

As illustrated in FIG. 2B, a curve obtained from a cross section taken along a plane parallel to the YZ plane is always the same curve formed by the curvature radius ry0. Moreover, a curve obtained from a cross section taken along a plane parallel to the XZ plane always has a curvature radius rx0. Note that a curve obtained from a cross section cut out by a plane parallel to the YZ plane has an optical surface shape necessary for obtaining a desired horizontal field of view (HFOV) as described above, and is not limited to a spherical surface, and may be a free-form surface shape or an aspherical surface shape.

This optical surface shape can be expressed by the following conditional expression.

$$z=(y^2/ry)/(1+(1-(1+k)\cdot y^2/ry^2)^{1/2})$$

$$+A\cdot y^4+B\cdot y^6+C\cdot y^8+\ldots.$$

$$+(x^2/rx)/(1+(1-x^2/rx^2)^{1/2})$$

Herein, x, y, and z are coordinates on the X axis, the Y axis, and the Z axis, respectively, κ is a conic constant, A, B, and C are fourth, sixth, and eighth aspheric coefficients, respectively, rx is a curvature radius in the scanning direction, and ry is a curvature radius in the line direction. The first term represented by the variable y and up to the high-order term thereof are terms representing the lens surface shape in the y direction for generating a linear light beam, and the final term represented by the variable x is a term representing the lens shape in the x direction for creating a plane orthogonal to the scanned light beam.

Figure 3A:
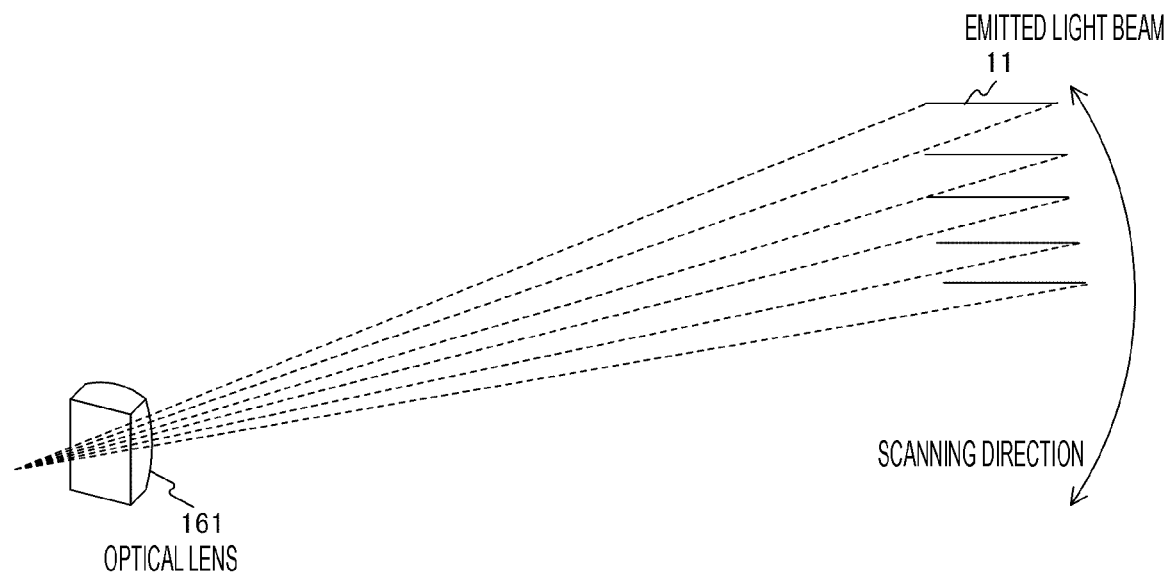
FIGS. 3A and 3B are diagrams illustrating a comparative example of the shape of an emitted light beam 11 formed by the optical lens 161 according to the first embodiment of the present technology.
Figure 3B:
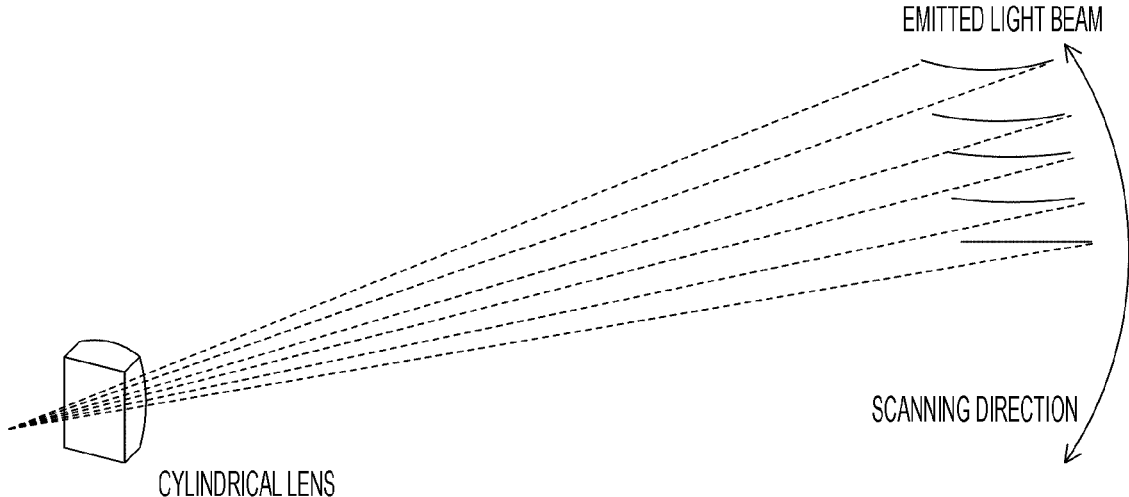

FIGS. 3A and 3B are diagrams illustrating a comparative example of the shape of an emitted light beam 11 formed by the optical lens 161 according to the first embodiment of the present technology.

As described above, because of the optical surface shape of the optical lens 161, and the curvature radius rx in the vertical (X) direction substantially coincide with the length from the optical surface to the virtual scanning center point Ox, the scanned light beam is always incident at an angle orthogonal to the vertical direction with respect to the optical surface. Therefore, as illustrated in FIG. 3A, the light beam is spread (or narrowed) only by the curvature radius ry in the Y direction, and the linear light beam emitted from the optical lens becomes a straight light beam without distortion regardless of the scanning position.

Meanwhile, as illustrated in FIG. 3B, in a case where a surface shape of an XY toroidal surface such as, for example, a cylindrical lens is used, it is difficult to obtain a straight light beam without distortion unlike the above-described embodiment. This toroidal surface has a curvature radius ry in the Y direction, and is formed by a rotationally symmetric surface having a position of a curvature radius rx from a position on the Z axis of the optical surface parallel to the Y axis as an axis.

Note that, in the above-described embodiment, the optical surface (S0) on the light incident side of the optical lens is an optical plane, but it is not limited thereto. For example, it is also possible to form the optical surface on the light incident side in a similar manner as the optical surface (S1) on the emission side described above and generate a straight light beam without distortion by the optical surfaces on both the incident side and the emission side.

[Semiconductor Laser]

Figure 4:
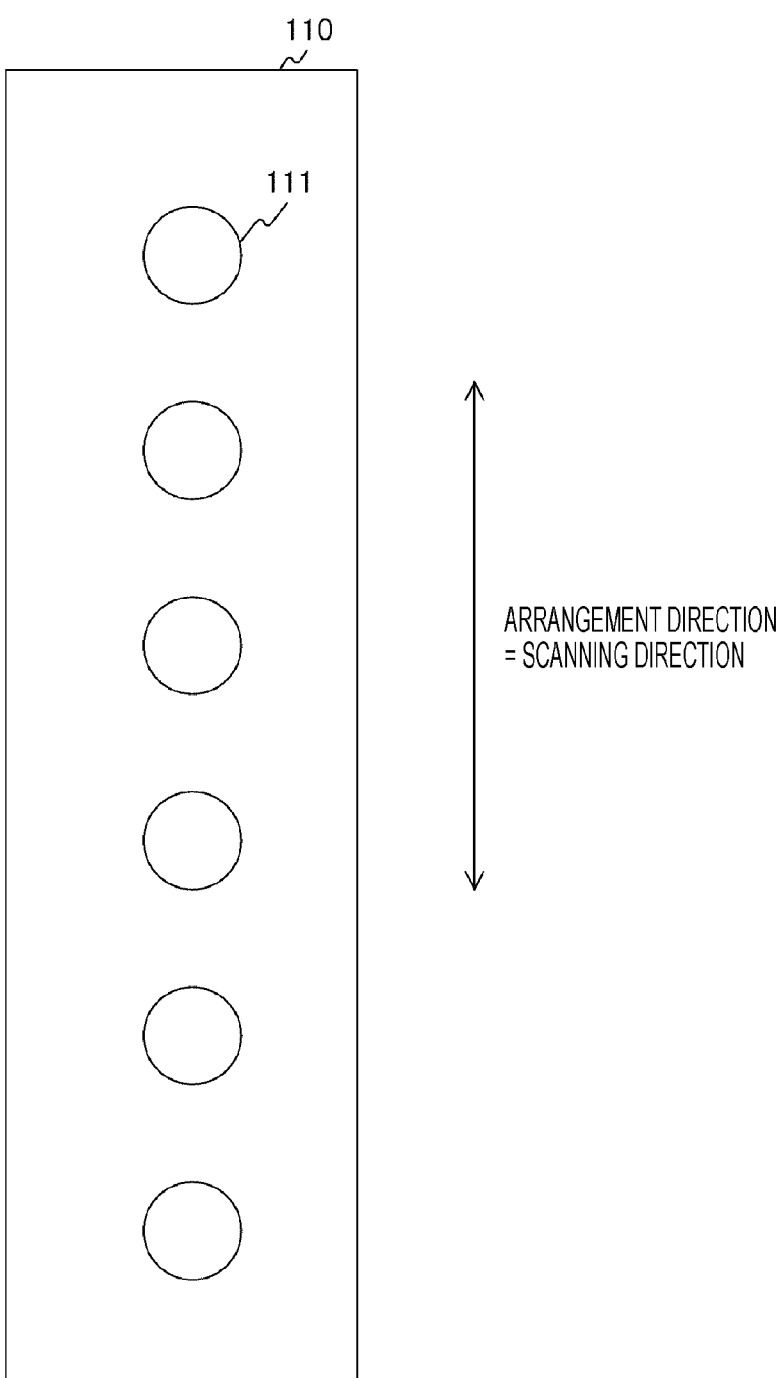
FIG. 4 is a diagram illustrating one example of a semiconductor laser 110 according to the first embodiment of the present technology.

FIG. 4 is a diagram illustrating one example of a semiconductor laser 110 according to the first embodiment of the present technology.

In the semiconductor laser 110 according to the first embodiment, a plurality of light emitting elements 111 is arranged one-dimensionally (one row). Each of the plurality of light emitting elements 111 can be assumed to be, for example, a single emitter type semiconductor laser. The light emitted from one light emitting element 111 is collimated by the collimator lens 120 to form one line in the lateral direction via the optical lens 161.

Each of the plurality of light emitting elements 111 individually emits light, and sequential emission of light is switched. Therefore, the position of the line is switched, and scanning is performed. That is, the arrangement direction of the plurality of light emitting elements 111 is the scanning direction.

[Photodetector]

Figure 5:
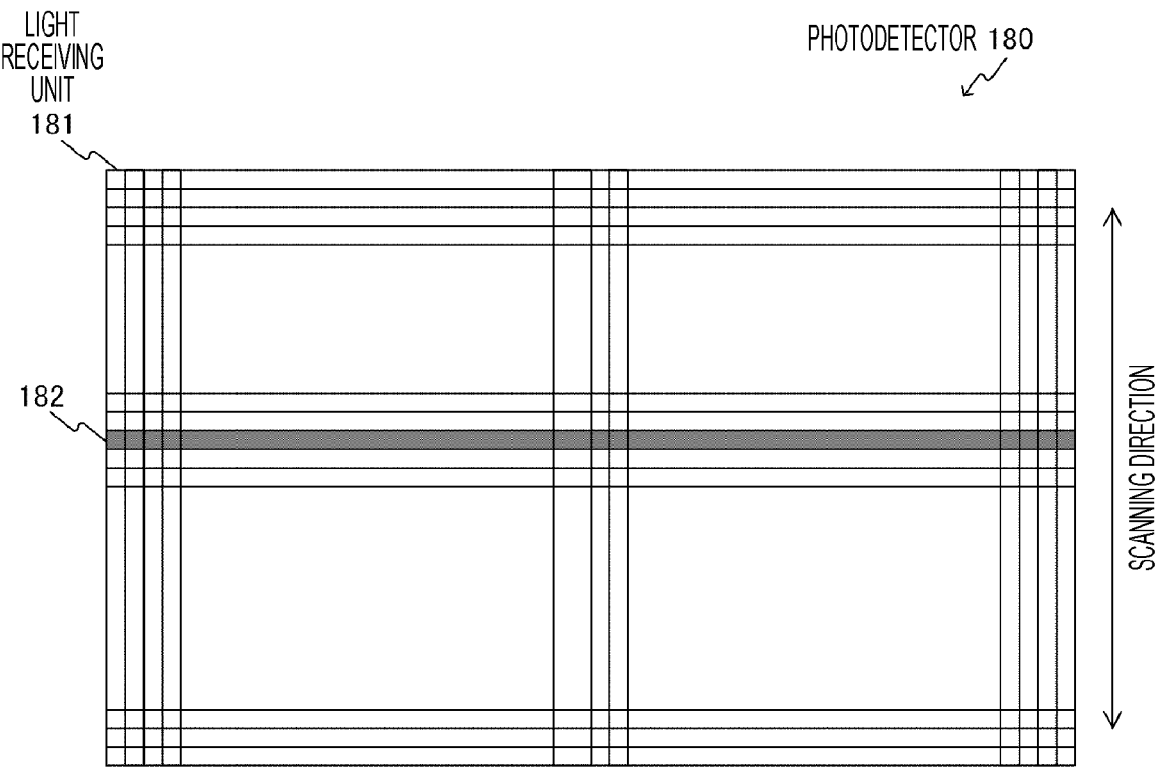
FIG. 5 is a diagram illustrating an example of a structure of a photodetector 180 according to the first embodiment of the present technology.

FIG. 5 is a diagram illustrating an example of a structure of the photodetector 180 according to the first embodiment of the present technology.

The photodetector 180 includes a plurality of light receiving units 181 obtained by division in the vertical direction and the horizontal direction. The light beam scanned at a certain position is reflected and scattered by a target object and guided to the linear light receiving units 181 aligned horizontally. Since the linear light beam obtained herein is straight without distortion, it is easy to selectively turn on only the light receiving unit 182 of the line necessary for detecting the reflected light and to turn off the light receiving unit 181 of the other line. This makes it possible to reduce noise generated by the influence of unnecessary light from external light such as sunlight.

Note that the reflected light beam 12 detected by the photodetector 180 has a vertical relationship opposite to that of the emitted light beam 11. Therefore, in a case where scanning is performed from the top to the bottom by switching the light emission of the semiconductor laser 110, it is necessary to control the light receiving unit 181 to be enabled from the bottom to the top in the photodetector 180.

As described above, in the first embodiment of the present technology, the optical surface shape of the optical lens 161 is utilized to form a linear light beam orthogonal to the light beam scanned by switching light emission of the semiconductor laser 110. This makes it possible to generate the straight emitted light beam 11 without distortion.

2. SECOND EMBODIMENT

[Distance Measuring Apparatus]

Figure 6:
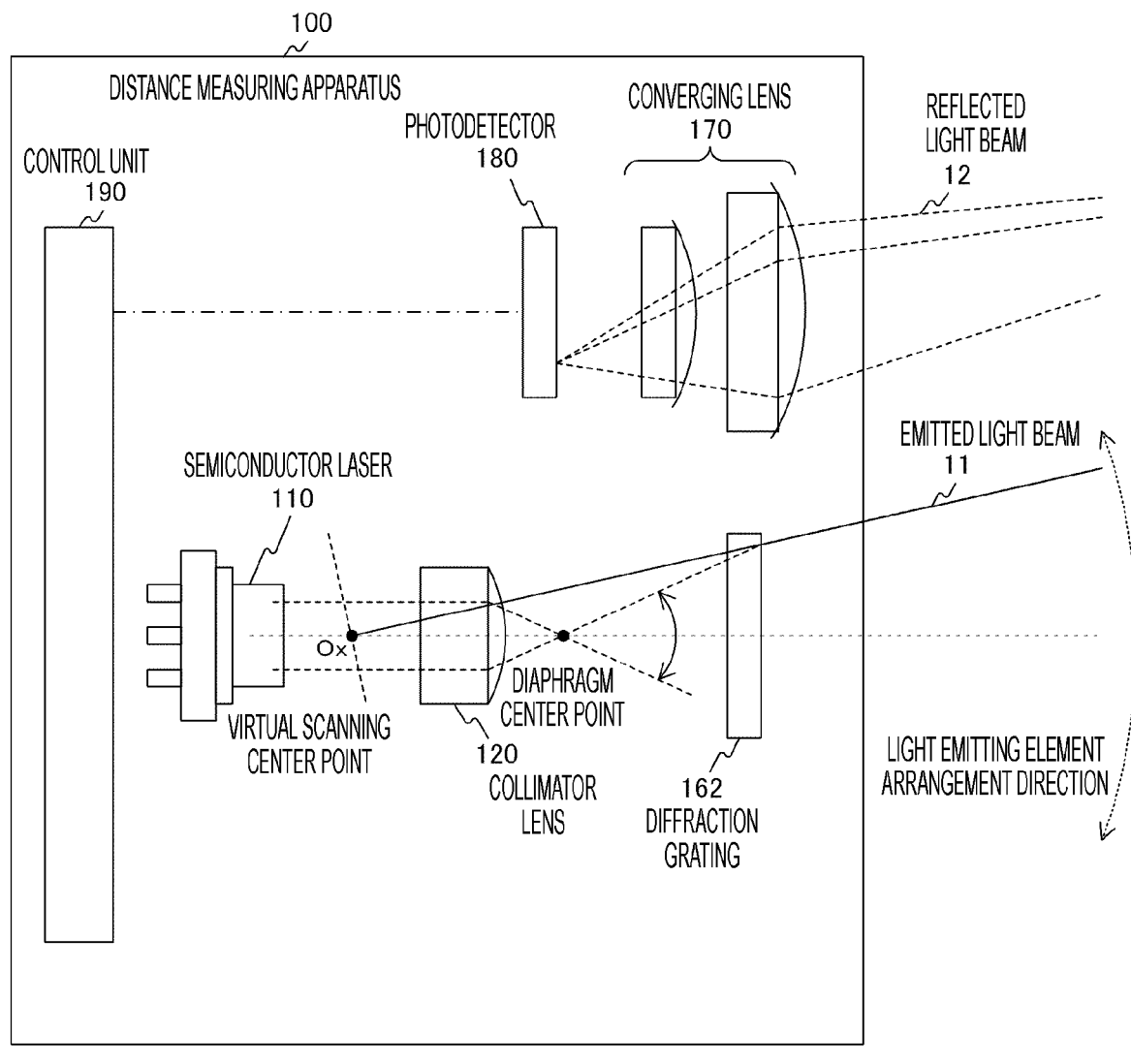
FIG. 6 is a diagram illustrating a configuration example of a distance measuring apparatus 100 according to a second embodiment of the present technology.

FIG. 6 is a diagram illustrating a configuration example of a distance measuring apparatus 100 according to a second embodiment of the present technology.

In the first embodiment described above, the linear light beam is generated by using the optical lens 161, but in the second embodiment, a linear light beam is generated by using a diffraction grating 162. Therefore, the second embodiment is similar to the first embodiment except that the diffraction grating 162 is provided instead of the optical lens 161 in the first embodiment, and thus detailed description of other components is omitted.

The diffraction grating 162 is an optical element having a serration-shaped grating with respect to the scanning direction. The Fresnel lens is being formed in the scanning direction, and the optical surface shape thereof conforms to the surface shape of the first embodiment. As a material of the diffraction grating 162, glass or resin is assumed. Note that the diffraction grating 162 is one example of a light conversion unit described in the claims.

Furthermore, as for the surface shape in the direction orthogonal to the scanning direction, various shapes that can be processed with respect to the optical plane can be applied. Specific examples thereof will be described below.

[Diffraction Grating]

Figure 7:
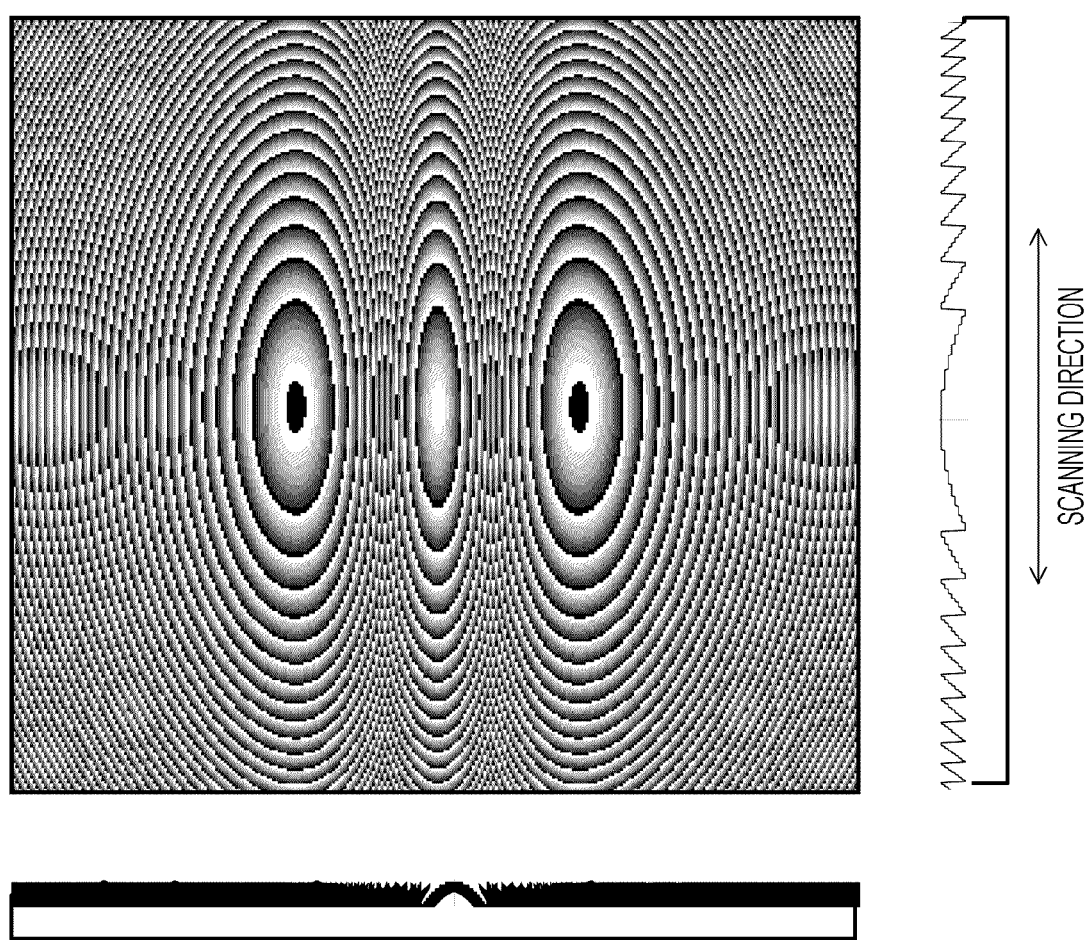
FIG. 7 is a diagram illustrating a first example of a diffraction grating 162 according to the second embodiment of the present technology.

FIG. 7 is a diagram illustrating a first example of the diffraction grating 162 according to the second embodiment of the present technology.

The first example of the diffraction grating 162 is a Fresnel lens including a step-shaped grating in both a scanning direction and a direction orthogonal to the scanning direction. That is, it is equivalent to that the optical surface of the first embodiment is achieved by a Fresnel lens. In the creation of the serration shape, the shape may be literally a serration shape by cutting, or may be a step-like shape by a semiconductor lithography process. In the drawing, as one example of the serration shape, an example of a stepwise (eight levels) shape is illustrated. Accordingly, a linear light beam having a desired divergence angle is generated.

Figure 8:
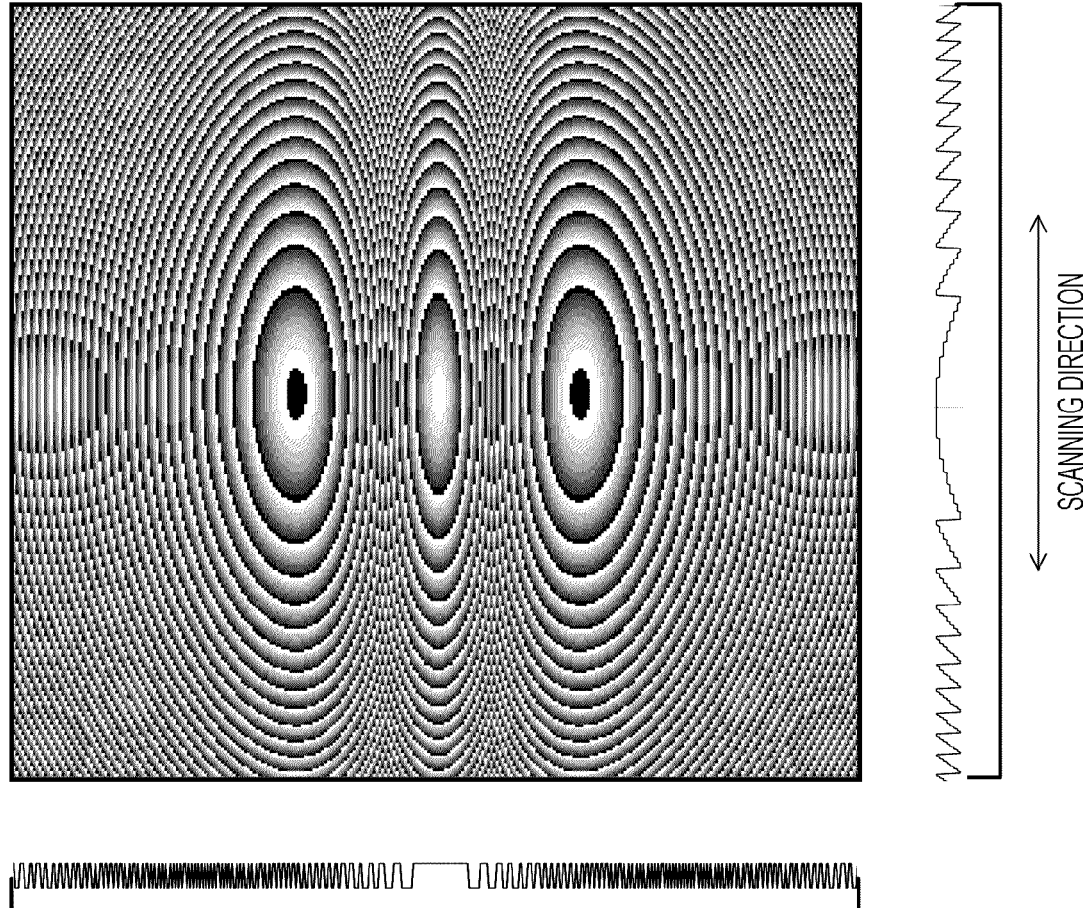
FIG. 8 is a diagram illustrating a second example of the diffraction grating 162 according to the second embodiment of the present technology.

FIG. 8 is a diagram illustrating a second example of the diffraction grating 162 according to the second embodiment of the present technology.

The second example of the diffraction grating 162 is a Fresnel lens including a serration-shaped grating in a scanning direction and a rectangular-shaped grating in a direction orthogonal to the scanning direction. Accordingly, a linear light beam having a desired divergence angle is generated using the ±first-order light.

Figure 9:
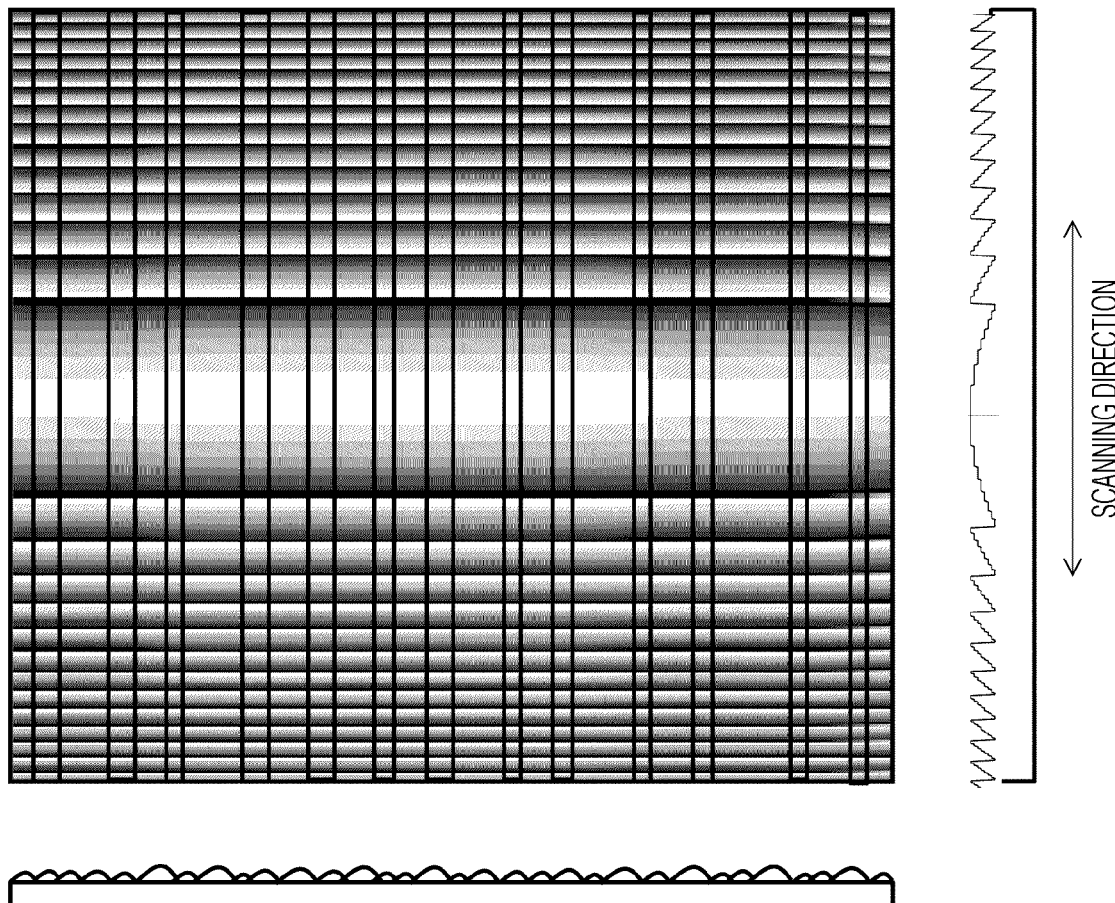
FIG. 9 is a diagram illustrating a third example of the diffraction grating 162 according to the second embodiment of the present technology.

FIG. 9 is a diagram illustrating a third example of the diffraction grating 162 according to the second embodiment of the present technology.

The third example of the diffraction grating 162 is a Fresnel lens including a serration-shaped grating in a scanning direction, a linear diffusion plate is provided in a direction orthogonal to the scanning direction, and a linear light beam having a desired divergence angle is generated only in the horizontal direction.

Note that, in a case where the shape in the first to third examples can be processed with respect to the curved surface, it can be applied to the lens surface shape, but in consideration of ease of processing and batch production by processing at a wafer level, processing to an optical plane is more desirable.

As described above, according to the second embodiment of the present technology, it is possible to generate the straight emitted light beam 11 without distortion by forming the linear light beam orthogonal to the scanned light beam using the diffraction grating 162.

3. THIRD EMBODIMENT

[Distance Measuring Apparatus]

Figure 10:
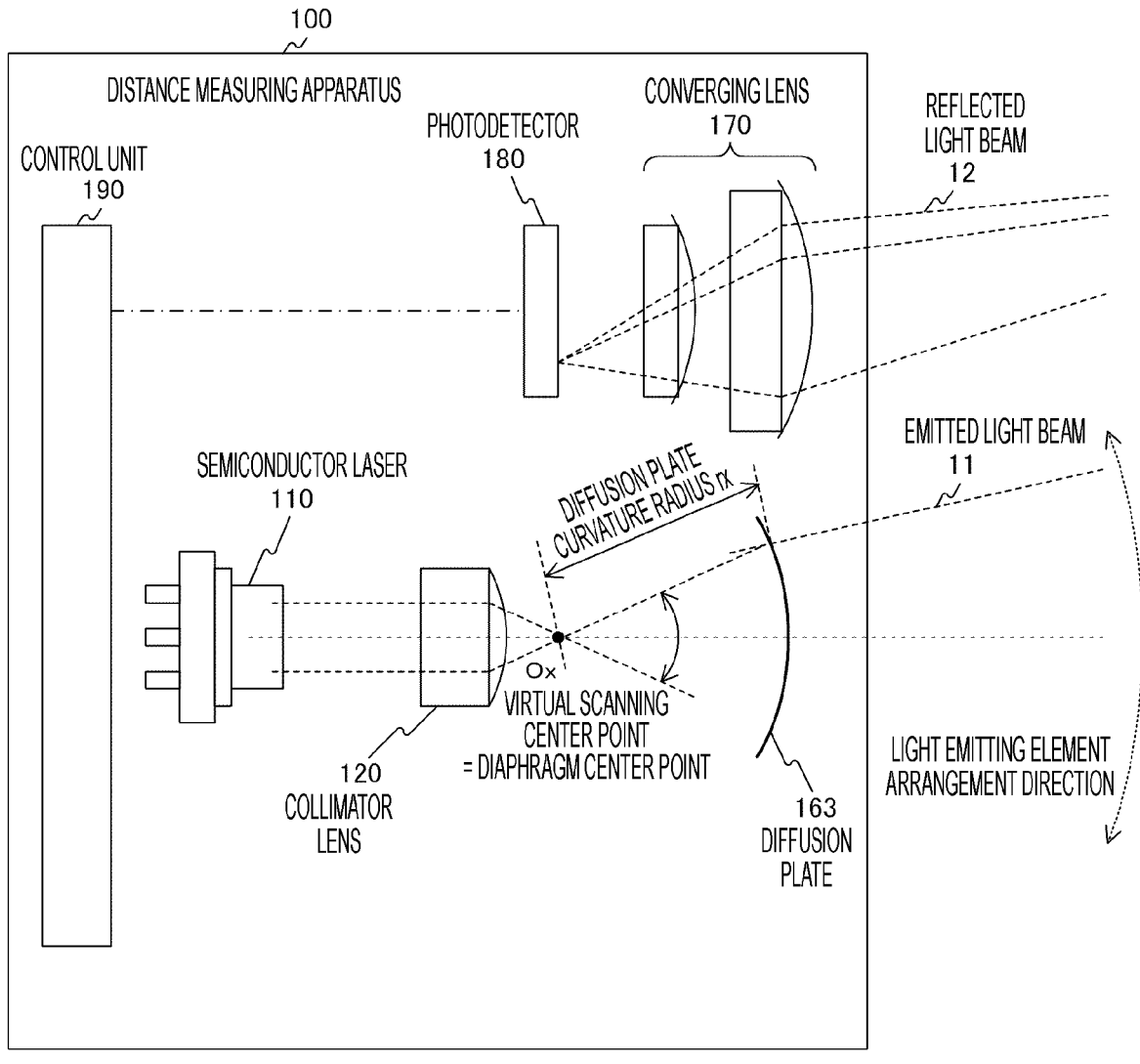
FIG. 10 is a diagram illustrating a configuration example of a distance measuring apparatus 100 according to a third embodiment of the present technology.

FIG. 10 is a diagram illustrating a configuration example of a distance measuring apparatus 100 according to a third embodiment of the present technology.

In the first embodiment described above, the linear light beam is generated by using the optical lens 161, but in the third embodiment, the linear light beam is generated by using a diffusion plate 163 Therefore, the third embodiment is similar to the first embodiment except that the diffusion plate 163 is provided instead of the optical lens 161 in the first embodiment, and thus detailed description of other components is omitted.

The diffusion plate 163 is a diffusion plate curved to have curvature radius rx when viewed from the virtual scanning center point. The curvature radius rx of the curved diffusion plate 163 in the vertical (X) direction is desirably set to be substantially equal to the length from the virtual scanning center point to the optical surface on the emission side regardless of the position in the horizontal direction. Therefore, the scanned light beam is always incident at an angle orthogonal to the direction perpendicular to the optical surface, and the light beam is spread only in the direction vertical to the scanning direction by the linear portion of diffusion plate 163. Therefore, the linear light beam emitted from diffusion plate 163 becomes a straight light beam without distortion regardless of the scanning position. In this example, the virtual scanning center point coincides with the diaphragm center point at which the light beam emitted from each light emitting element is converged. Note that the diffusion plate 163 is one example of a light conversion unit described in the claims.

Figure 11:
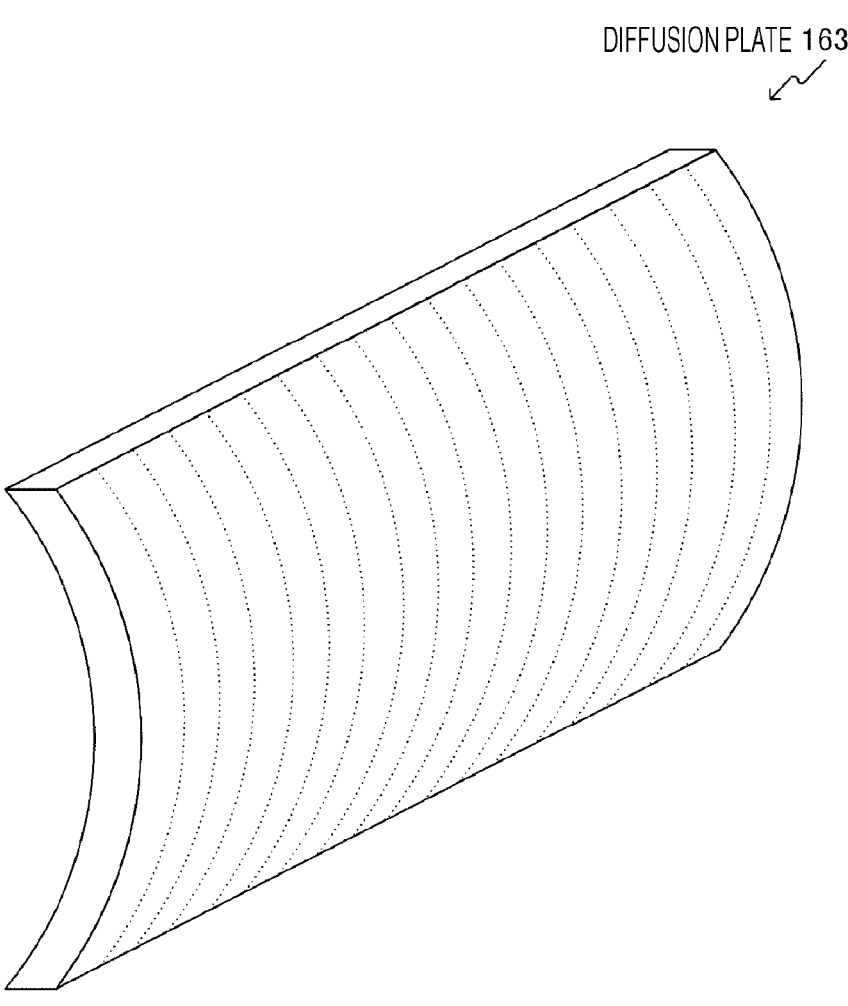
FIG. 11 is a diagram illustrating an example of a shape of a diffusion plate 163 according to the third embodiment of the present technology.

FIG. 11 is a diagram illustrating an example of a shape of the diffusion plate 163 according to a third embodiment of the present technology.

In this example, the diffusion plate 163 is curved in the vertical direction, while a direction orthogonal to the vertical direction has a straight shape. Therefore, unlike a surface shape of an XY toroidal surface such as a cylindrical lens, a straight light beam can be generated without distortion.

As described above, according to the third embodiment of the present technology, it is possible to generate the straight emitted light beam 11 without distortion by forming the linear light beam orthogonal to the scanned light beam using the diffusion plate 163.

4. FOURTH EMBODIMENT

[Distance Measuring Apparatus]

Figure 12:
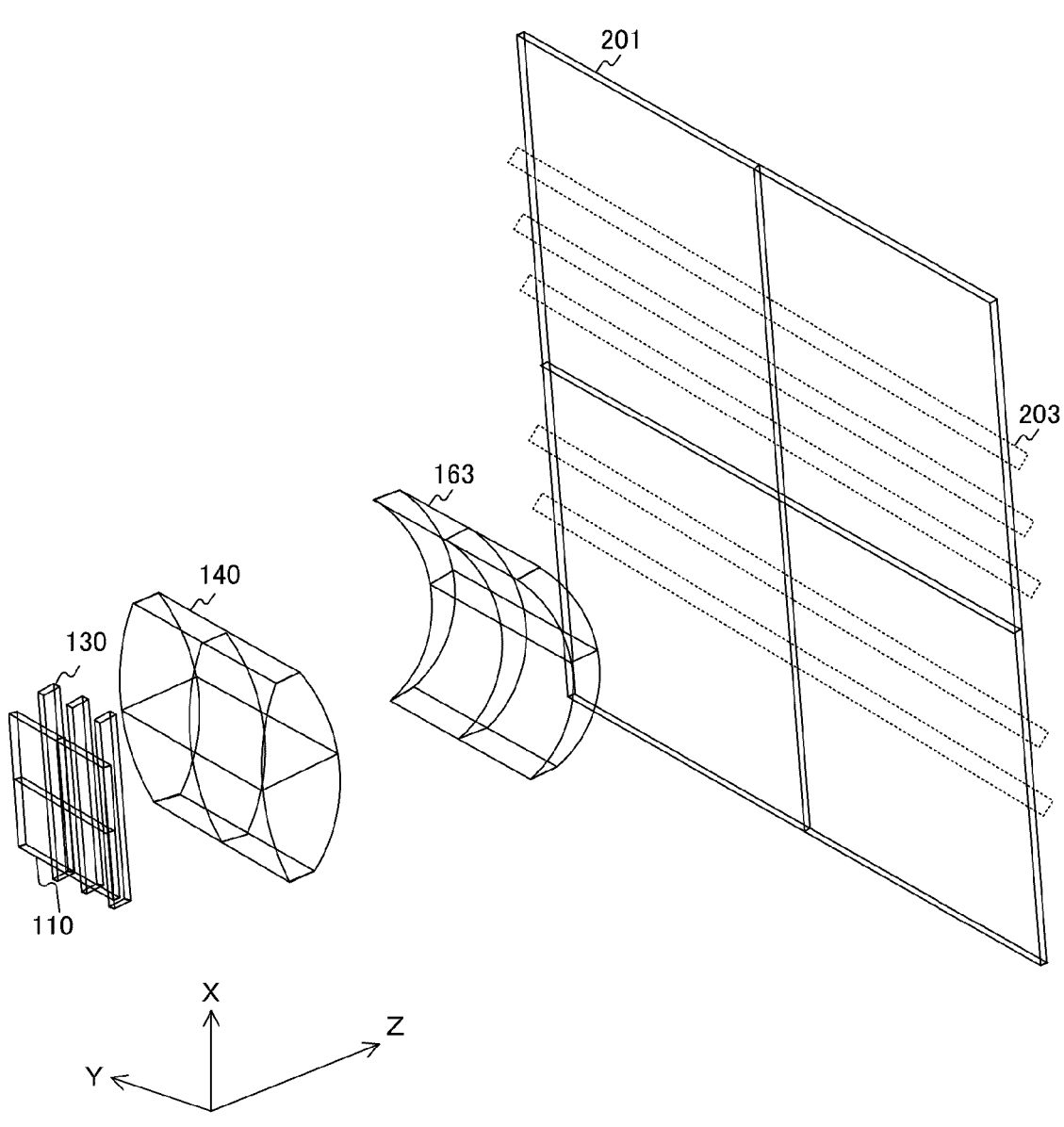
FIG. 12 is a diagram illustrating a configuration example of a distance measuring apparatus 100 according to a fourth embodiment of the present technology.

FIG. 12 is a diagram illustrating a configuration example of a distance measuring apparatus 100 according to a fourth embodiment of the present technology.

In the above-described embodiment, the semiconductor laser 110 formed by the light emitting elements arranged one-dimensionally is assumed, but in the following embodiment, the semiconductor laser 110 in which the light emitting elements are arranged two-dimensionally is assumed. In this case, it is assumed that the semiconductor laser 110 can switch the light emission for each column, and can scan a linear beam 203 on an object surface 201 by switching the light emission of the arranged light emitting elements.

In the fourth embodiment, a microcylindrical lens 130 is provided on the immediate upper surface of the semiconductor laser 110. Moreover, a cylindrical lens 140 is provided between the semiconductor laser 110 and the diffusion plate 163.

The microcylindrical lens 130 is a lens having curvature only in a line direction substantially orthogonal to the scanning direction. The microcylindrical lens 130 collimates the light beams emitted from the individual light emitting elements of the semiconductor laser 110 and emits the mutual light beams in parallel. Note that, although an example in which rod-shaped microcylindrical lenses are individually arranged is described in the drawing it is also possible to arrange a microcylindrical lens array in which a plurality of microcylindrical lenses is formed on one flat plate.

The cylindrical lens 140 is a lens whose curvature direction is orthogonal to the microcylindrical lens 130. Therefore, the light beam incident on the virtual scanning center point (virtual diaphragm center point) becomes similar to the light beam incident from the light emitting element arranged one-dimensionally as in the first to third embodiments.

Figure 13:
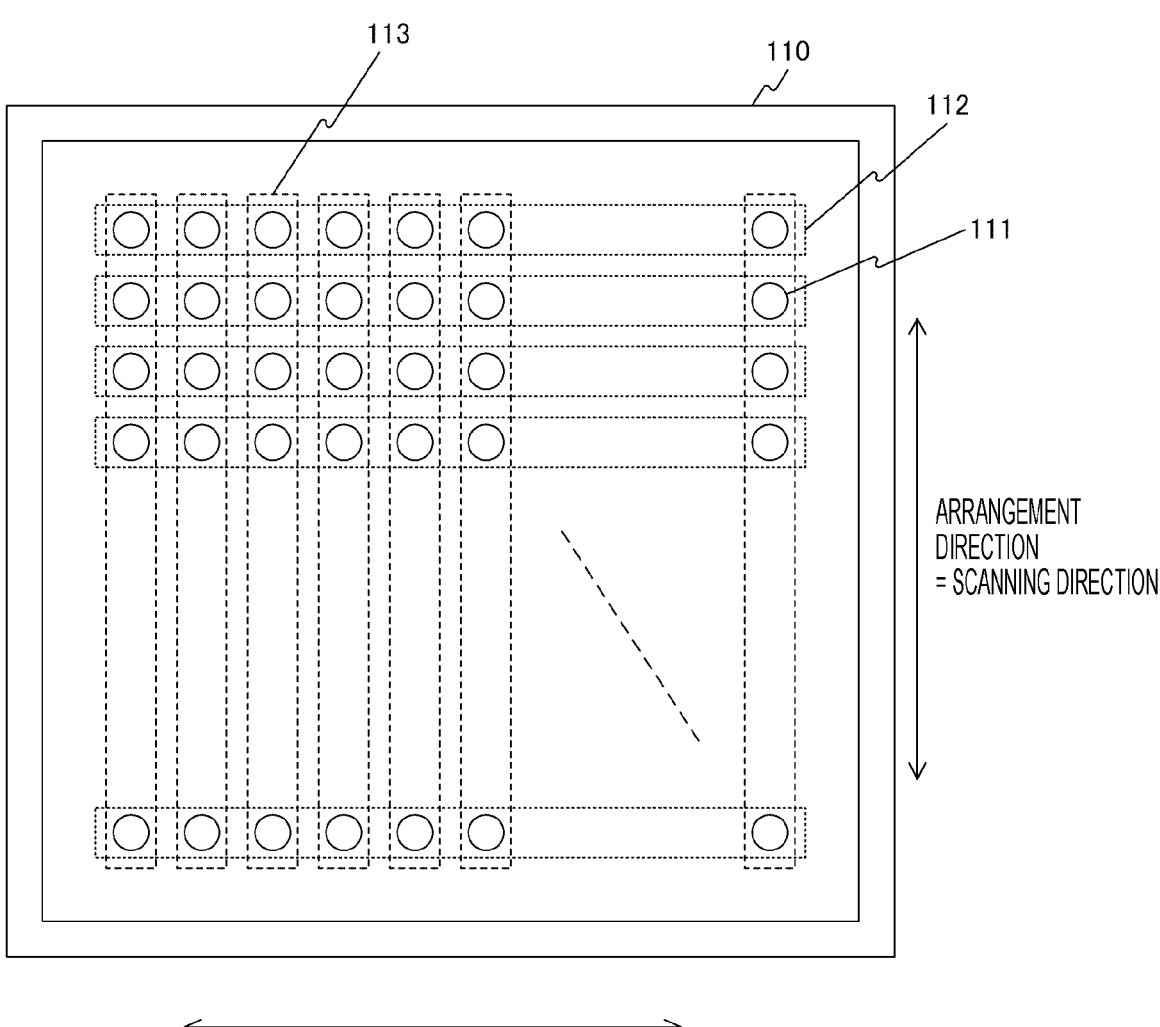
FIG. 13 is a diagram illustrating a configuration example of a semiconductor laser 110 according to the fourth embodiment of the present technology.
Figure 13:
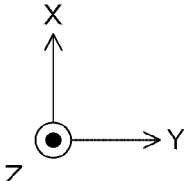

FIG. 13 is a diagram illustrating a configuration example of the semiconductor laser 110 according to the fourth embodiment of the present technology.

In the semiconductor laser 110 according to the fourth embodiment, the light emitting elements 111 are arranged two-dimensionally. In this drawing, the horizontal direction is the line direction (Y direction), and the vertical direction is the scanning direction (X direction). Among them, the light emitting elements 111 arranged in the lateral direction collectively emit light for each column 112. Scanning is performed by switching the light emission for each column 112. Note that, in the fourth embodiment, an example in which the light emitting element 111 is two-dimensionally included in one semiconductor laser 110 has been described; however, the configuration is not limited to one, and for example, a configuration in which semiconductor lasers aligned in a row are arranged may be adopted.

Furthermore, the microcylindrical lenses 130 are arranged on the upper surfaces of the groups 113 of the light emitting elements 111 arranged in the longitudinal direction.

Figure 14:
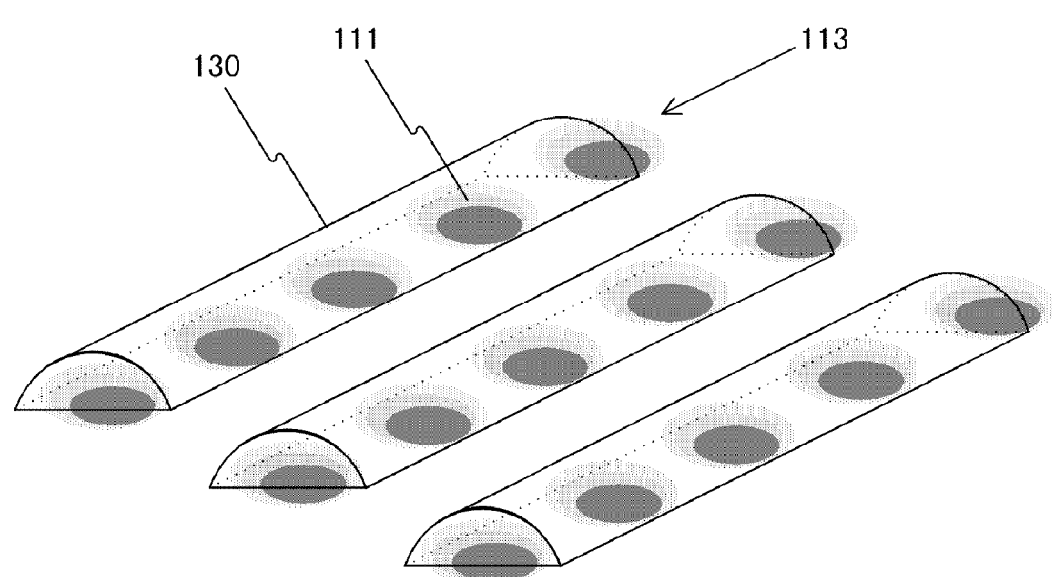
FIG. 14 is a diagram illustrating an arrangement example of a microcylindrical lens 130 according to the fourth embodiment of the present technology.

FIG. 14 is a diagram illustrating an arrangement example of a microcylindrical lens 130 according to the fourth embodiment of the present technology.

As illustrated in the drawing, the microcylindrical lens 130 has a shape continuous in a semi-cylindrical shape. The microcylindrical lenses 130 are arranged one by one with respect to the groups 113 in the longitudinal direction. Therefore, the microcylindrical lens 130 has curvature only in the lateral direction.

Figure 15:
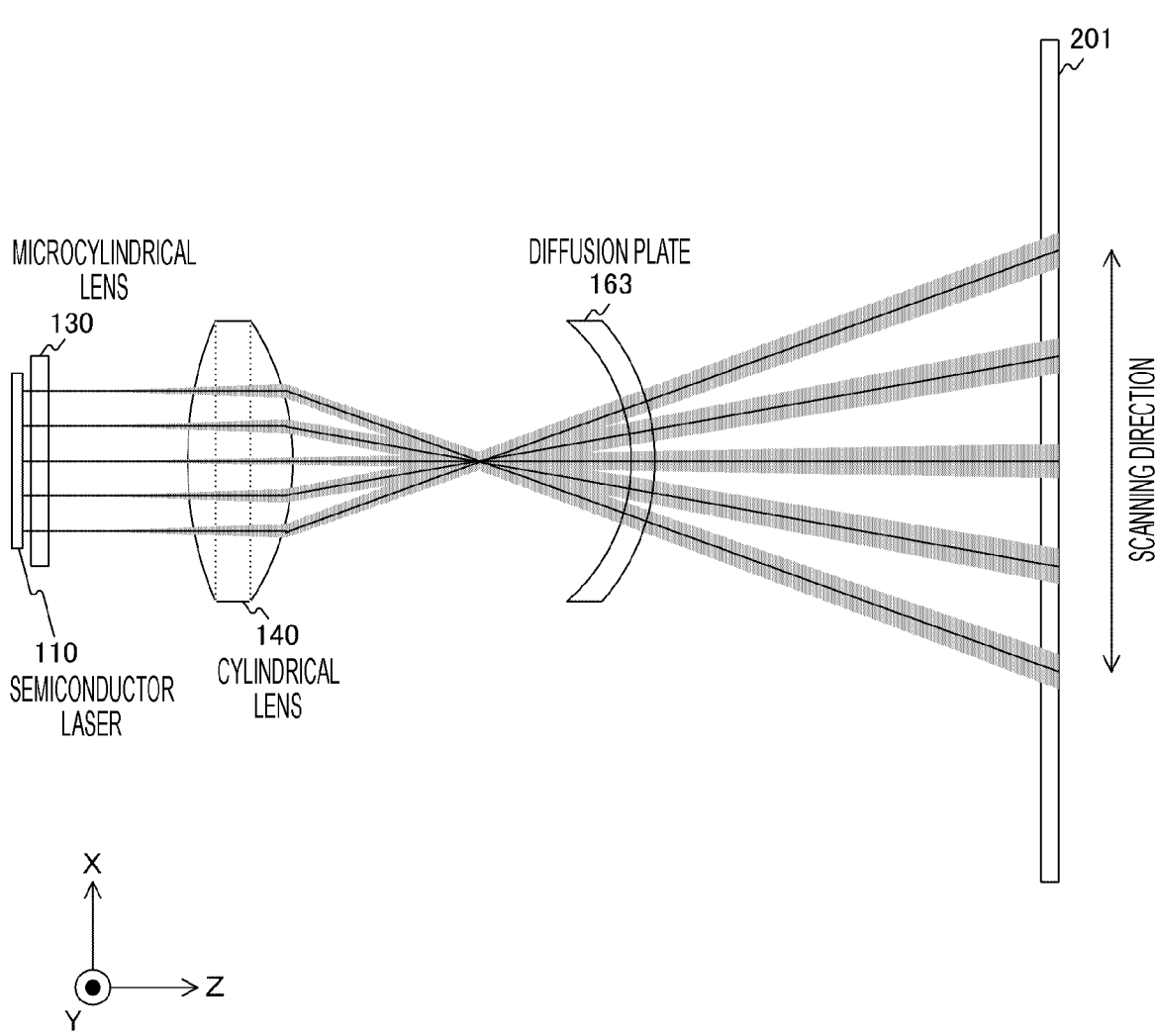
FIG. 15 is a diagram illustrating one example of a cross-sectional view of the distance measuring apparatus 100 according to the fourth embodiment of the present technology.
Figure 16:
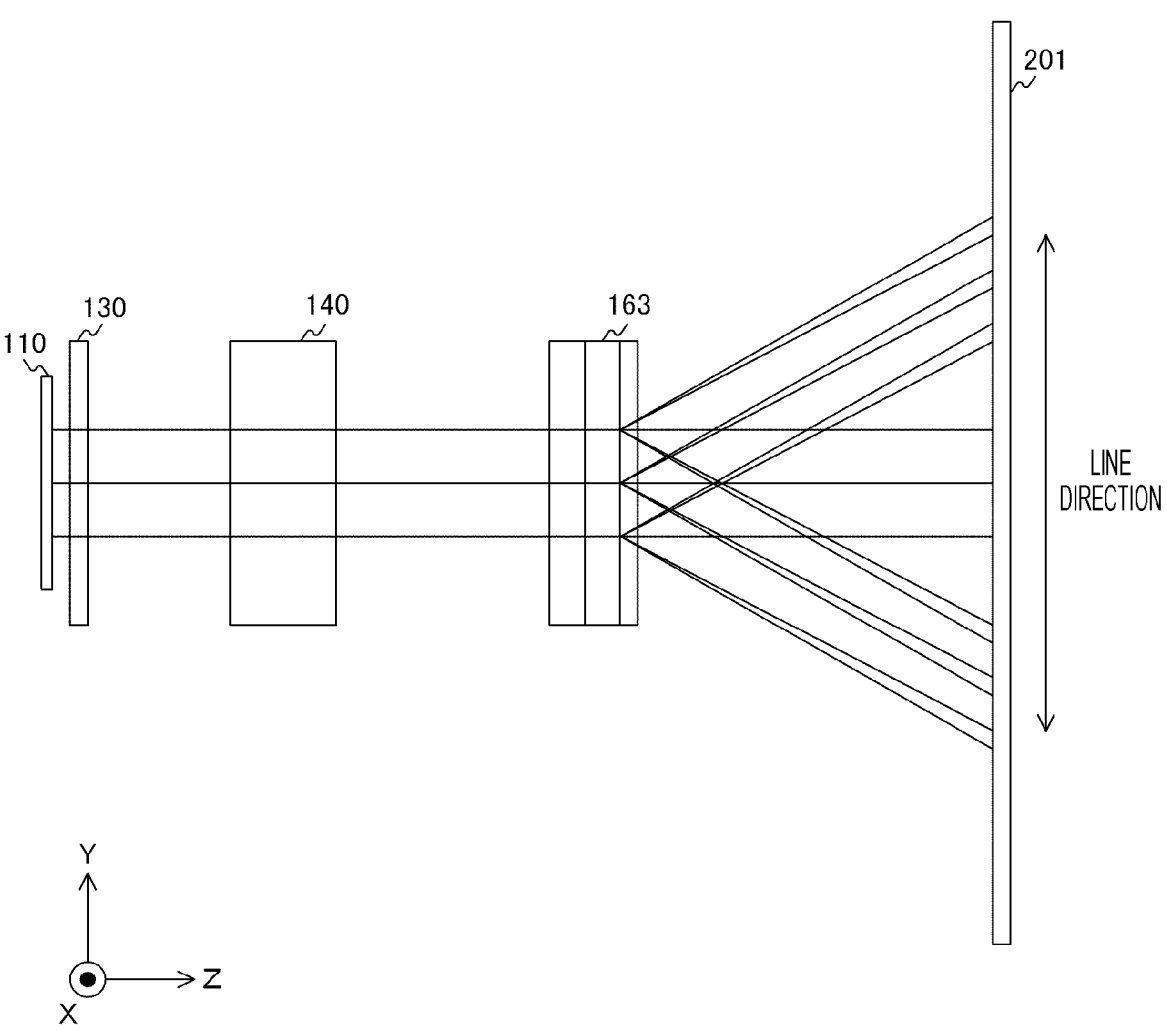
FIG. 16 is a diagram illustrating one example of an upper view of the distance measuring apparatus 100 according to the fourth embodiment of the present technology.

FIG. 15 is a diagram illustrating one example of a cross-sectional view of a distance measuring apparatus 100 according to the fourth embodiment of the present technology. FIG. 16 is a diagram illustrating one example of an upper view of a distance measuring apparatus 100 according to the fourth embodiment of the present technology.

In the fourth embodiment, light from the light emitting element 111 of the semiconductor laser 110 is collimated in accordance with the curvature of the microcylindrical lens 130, and light is emitted in parallel with respect to that direction.

Meanwhile, the light that has not been collimated without the action of the microcylindrical lens 130 is diverged until reaching the cylindrical lens 140, and becomes parallel light in the cylindrical lens 140.

Note that, in the fourth embodiment, it is assumed that the microcylindrical lens 130 is arranged as a separate component in the immediate vicinity of the surface light emitting semiconductor laser 110, but both may be integrally formed. In this case, it is more desirable to use a backside emission type surface light emitting laser as the semiconductor laser 110.

As described above, in the fourth embodiment of the present technology, the light from the semiconductor laser 110, in which the light emitting elements 111 are two-dimensionally arranged, is made into parallel light using the microcylindrical lens 130 and the cylindrical lens 140. Therefore, the light from the plurality of light emitting elements 111 can be reflected on one line, and the power of the output light can be improved.

Modification Example

Figure 17:
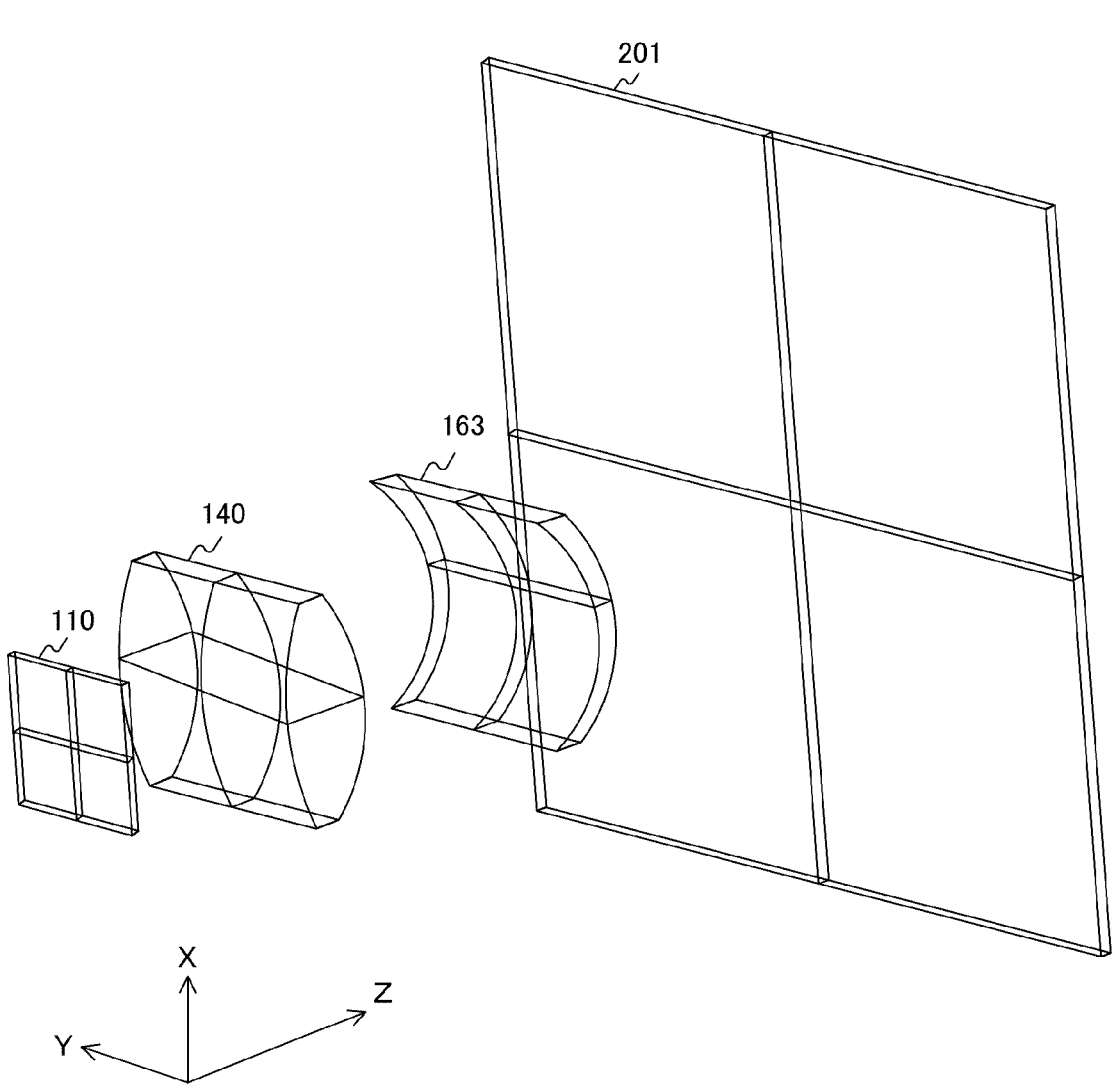
FIG. 17 is a diagram illustrating a modification example of the distance measuring apparatus 100 according to the fourth embodiment of the present technology.

FIG. 17 is a diagram illustrating a modification example of a distance measuring apparatus 100 according to a fourth embodiment of the present technology.

In the above-described fourth embodiment, the microcylindrical lens 130 and the cylindrical lens 140 are used, but only the cylindrical lens 140 may be used without using the microcylindrical lens 130. In this case, collimation is performed only in the scanning direction by the cylindrical lens 140.

5. FIFTH EMBODIMENT

[Distance Measuring Apparatus]

Figure 18:
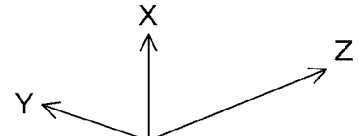
FIG. 18 is a diagram illustrating a configuration example of a distance measuring apparatus 100 according to a fifth embodiment of the present technology.

FIG. 18 is a diagram illustrating a configuration example of a distance measuring apparatus 100 according to a fifth embodiment of the present technology.

Also in the fifth embodiment, a semiconductor laser 110, in which light emitting elements 111 are two-dimensionally arranged, is assumed. Meanwhile, the collimator lens 120 is used similarly to the first to third embodiments without using the microcylindrical lens 130 and the cylindrical lens 140.

In this case, by making the angle of the X (scanning direction) −Z cross section of the light beam that passes through a collimator lens 120 and enters the virtual scanning center point (virtual diaphragm center point) constant regardless of the Y (line direction), it is possible to generate a linear light beam in which no distortion occurs. Therefore, in the fifth embodiment, the light emitting element 111 is arranged as follows in the semiconductor laser 110.

Figure 19:
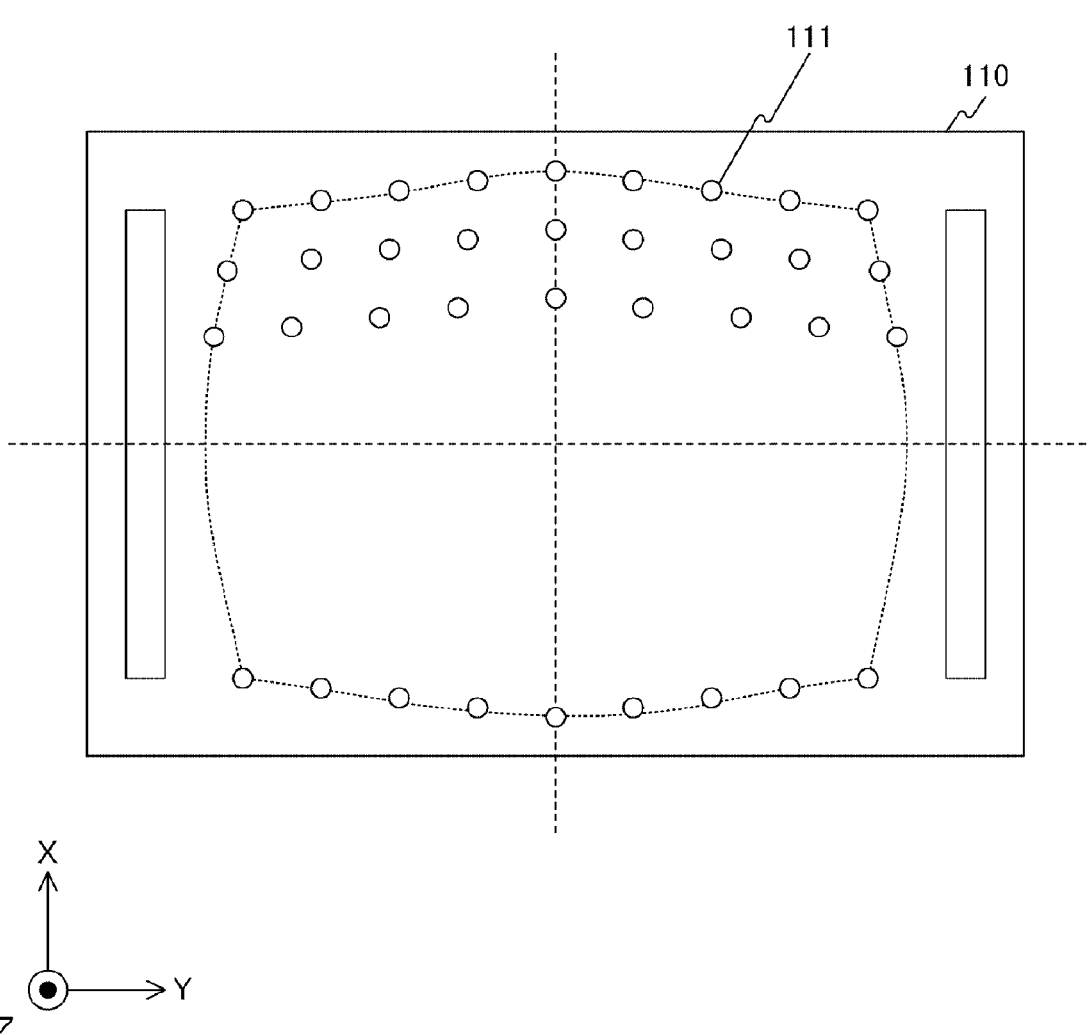
FIG. 19 is a diagram illustrating a configuration example of a semiconductor laser 110 according to the fifth embodiment of the present technology.

FIG. 19 is a diagram illustrating a configuration example of the semiconductor laser 110 according to the fifth embodiment of the present technology.

In this semiconductor laser 110 according to the fifth embodiment, the arrangement of the two-dimensional light emitting element 111 is expanded outward in a barrel shape in order to make the incident direction of the light beam constant regardless of Y (line direction). That is, the height in the X direction is changed outward and arranged in accordance with the position in the Y direction.

Figure 20:
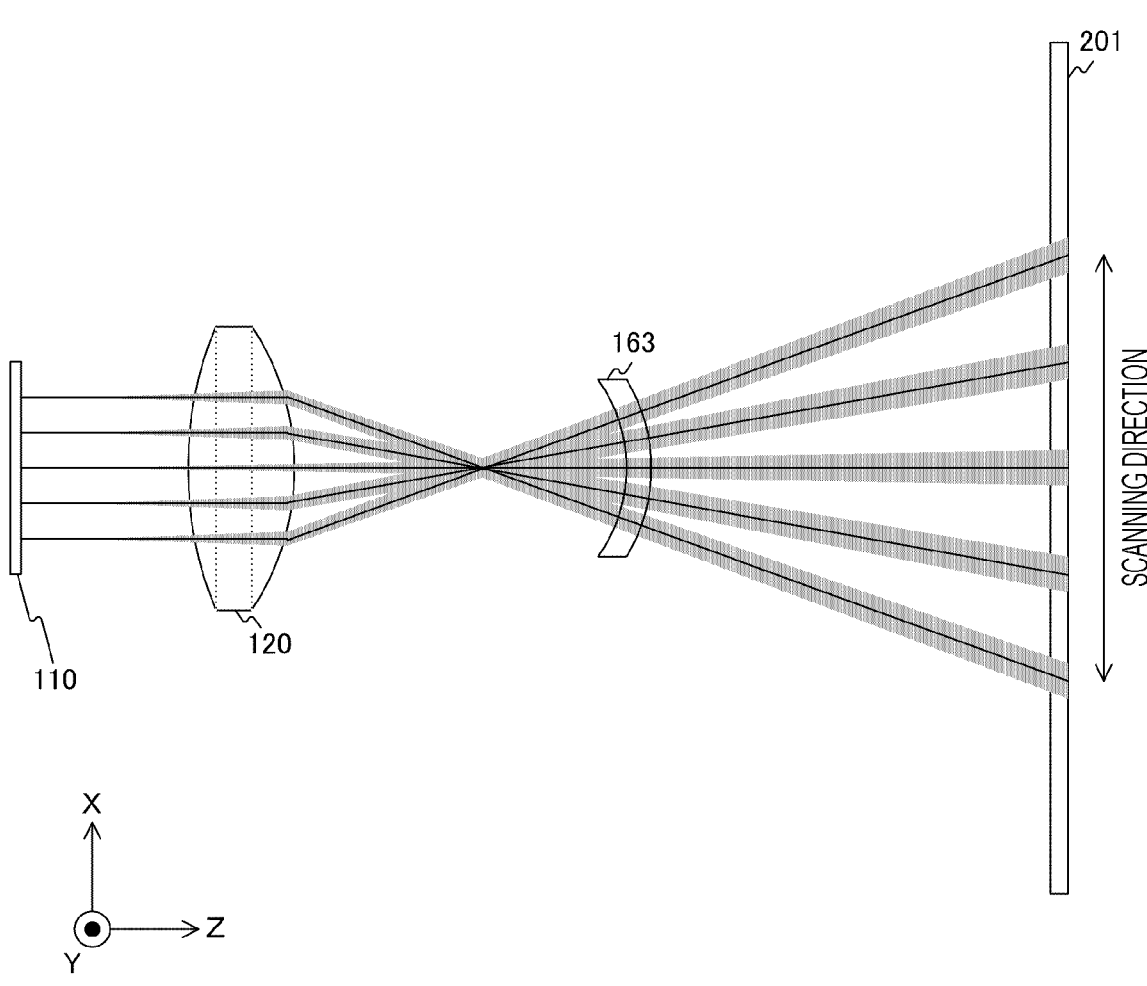
FIG. 20 is a diagram illustrating one example of a cross-sectional view of a distance measuring apparatus 100 according to the fifth embodiment of the present technology.
Figure 21:
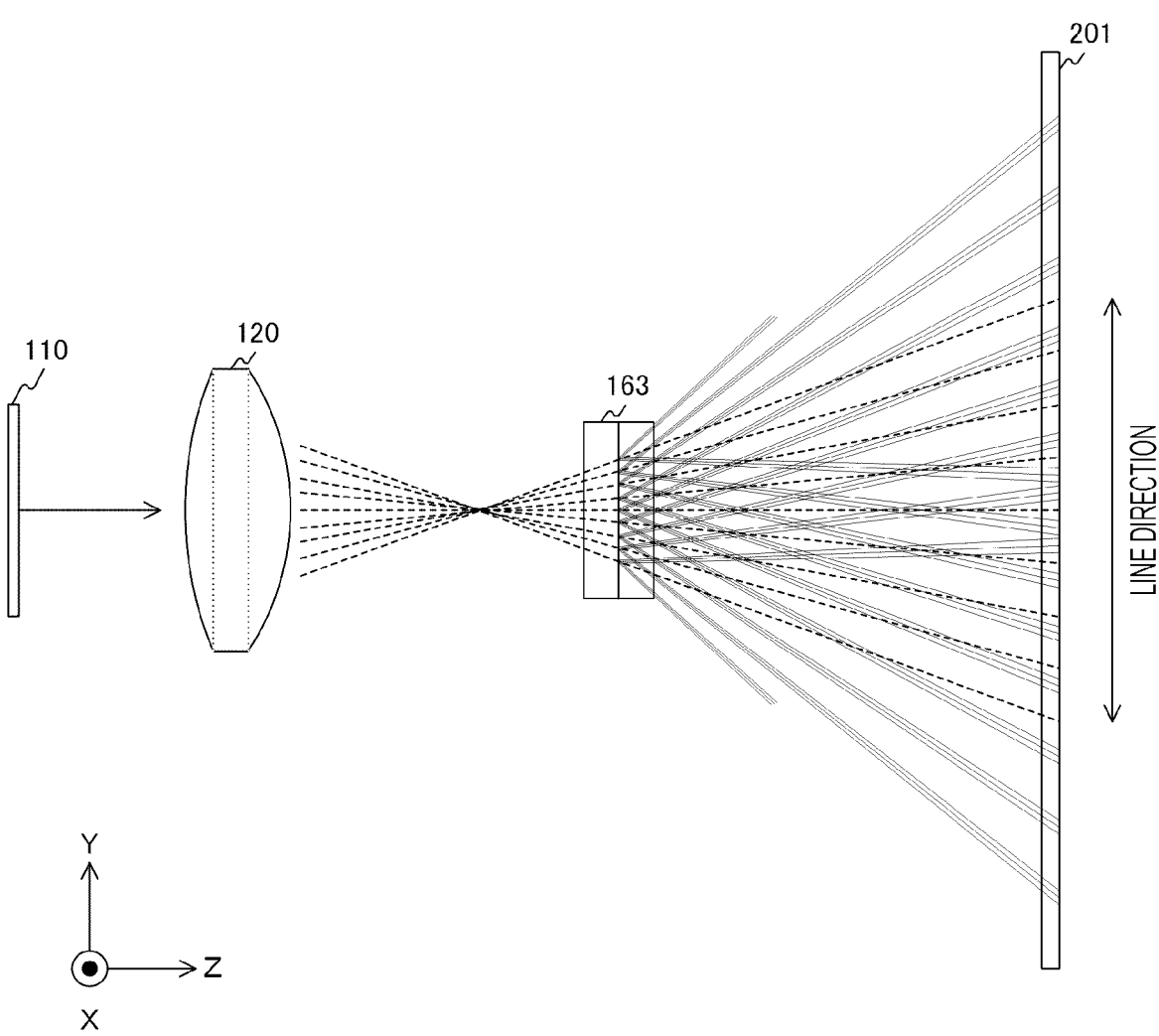
FIG. 21 is a diagram illustrating one example of an upper view of the distance measuring apparatus 100 according to the fifth embodiment of the present technology.

FIG. 20 is a diagram illustrating one example of a cross-sectional view of a distance measuring apparatus 100 according to the fifth embodiment of the present technology. FIG. 21 is a diagram illustrating one example of an upper view of the distance measuring apparatus 100 according to the fifth embodiment of the present technology.

As described above, according to the fifth embodiment of the present technology, by arranging the two-dimensional light emitting element 111 in the distance measuring apparatus 100 in a barrel shape, it is possible to generate a linear light beam in which no distortion occurs.

Modification Example

Figure 22:
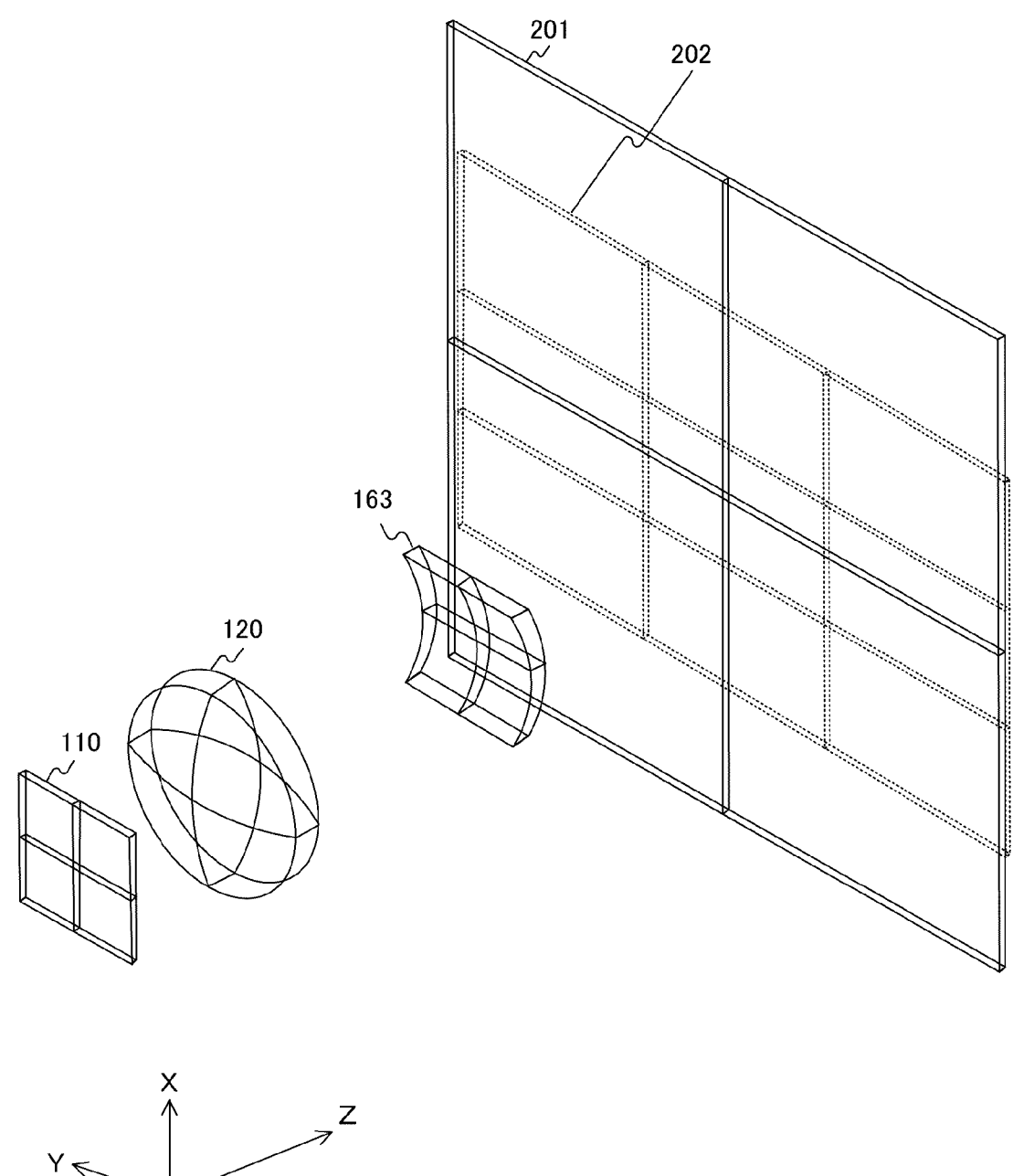
FIG. 22 is a diagram illustrating a modification example of the distance measuring apparatus 100 according to the fifth embodiment of the present technology.

FIG. 22 is a diagram illustrating a modification example of a distance measuring apparatus 100 according to the fifth embodiment of the present technology.

In the fifth embodiment described above, the technology of generating the linear light beam without distortion has been described. On the other hand, by further switching the light emitting element 111 with respect to the region in the line direction and performing two-dimensional light emission switching, the two-dimensional divided region 202 can be scanned without being distorted by the zone drive system. This makes it possible to generate a two-dimensional region light beam without distortion. Note that, in the drawing, an example of division into nine regions is illustrated, but the number of divisions, the division direction, and the division shape are not limited thereto.

6. SIXTH EMBODIMENT

[Distance Measuring Apparatus]

Figure 23:
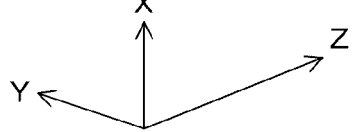
FIG. 23 is a diagram illustrating a configuration example of a distance measuring apparatus 100 according to a sixth embodiment of the present technology.
Figure 24:
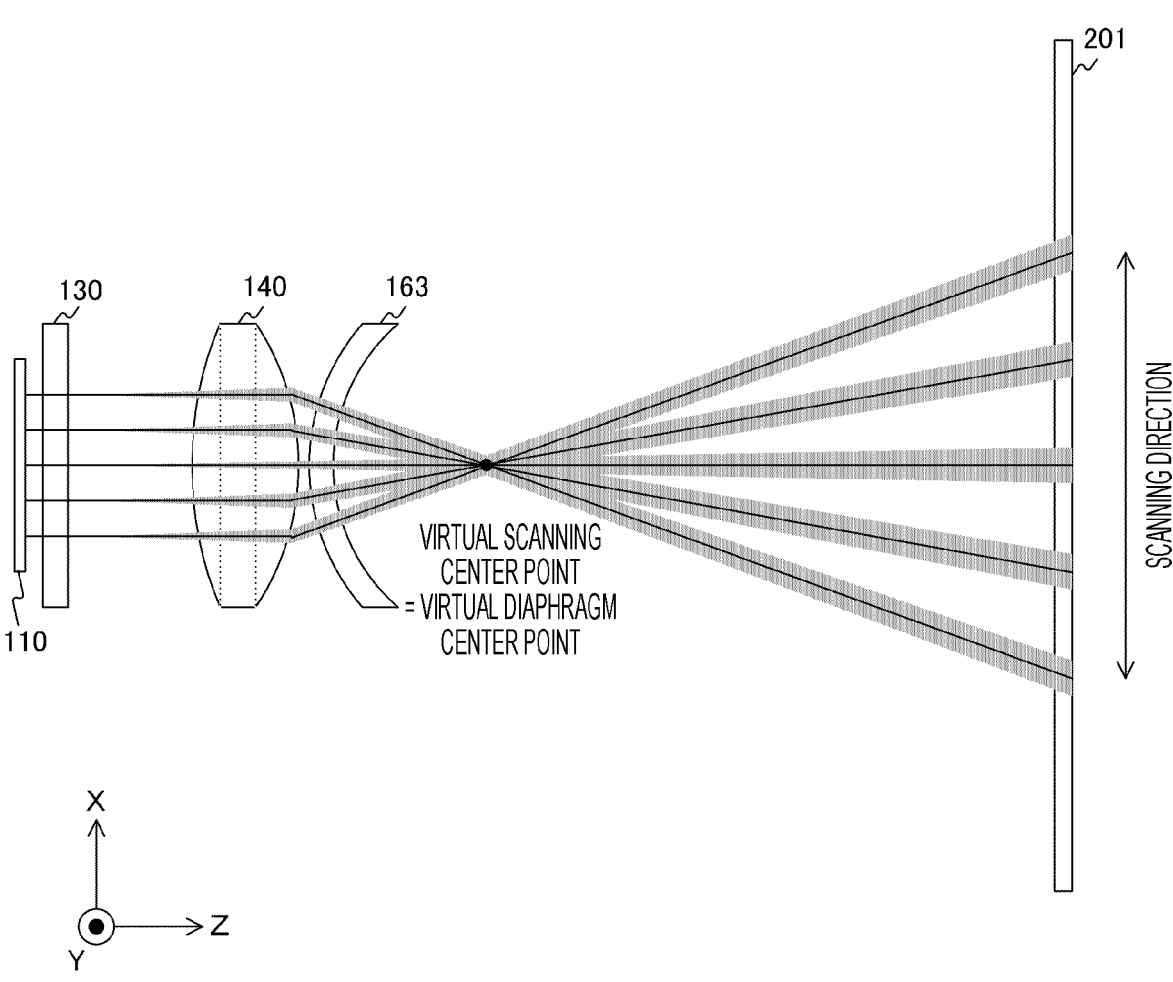
FIG. 24 is a diagram illustrating one example of a cross-sectional view of the distance measuring apparatus 100 according to the sixth embodiment of the present technology.

FIG. 23 is a diagram illustrating a configuration example of a distance measuring apparatus 100 according to a sixth embodiment of the present technology. FIG. 24 is a diagram illustrating one example of a cross-sectional view of a distance measuring apparatus 100 according to the sixth embodiment of the present technology.

In the above-described embodiment, the optical lens 161, the diffraction grating 162, or the diffusion plate 163 is arranged on the deeper side of the virtual scanning center point (virtual diaphragm center point). On the other hand, in this example, based on the configuration example of the semiconductor laser 110 in the above-described fourth embodiment, the diffusion plate 163 is arranged on the front side of the virtual scanning center point (virtual diaphragm center point). Also in this case, the curvature radius of the optical surface of the diffusion plate 163 in the scanning direction is substantially equal to the distance from the virtual diaphragm center point in the scanning direction to the center point of the optical surface of the diffusion plate 163 regardless of the position in the line direction. Therefore, similar to the fourth embodiment, it is possible to generate a linear light beam in which no distortion occurs.

Herein, an example based on the configuration example of the semiconductor laser 110 in the fourth embodiment has been described, but it may be based on another configuration example of the first to third and fifth embodiments. That is, the optical lens 161 and the diffraction grating 162 may be arranged before the virtual scanning center point (virtual diaphragm center point). Therefore, similar to the first to third and fifth embodiments, it is possible to generate a linear light beam in which no distortion occurs.

Figure 25:
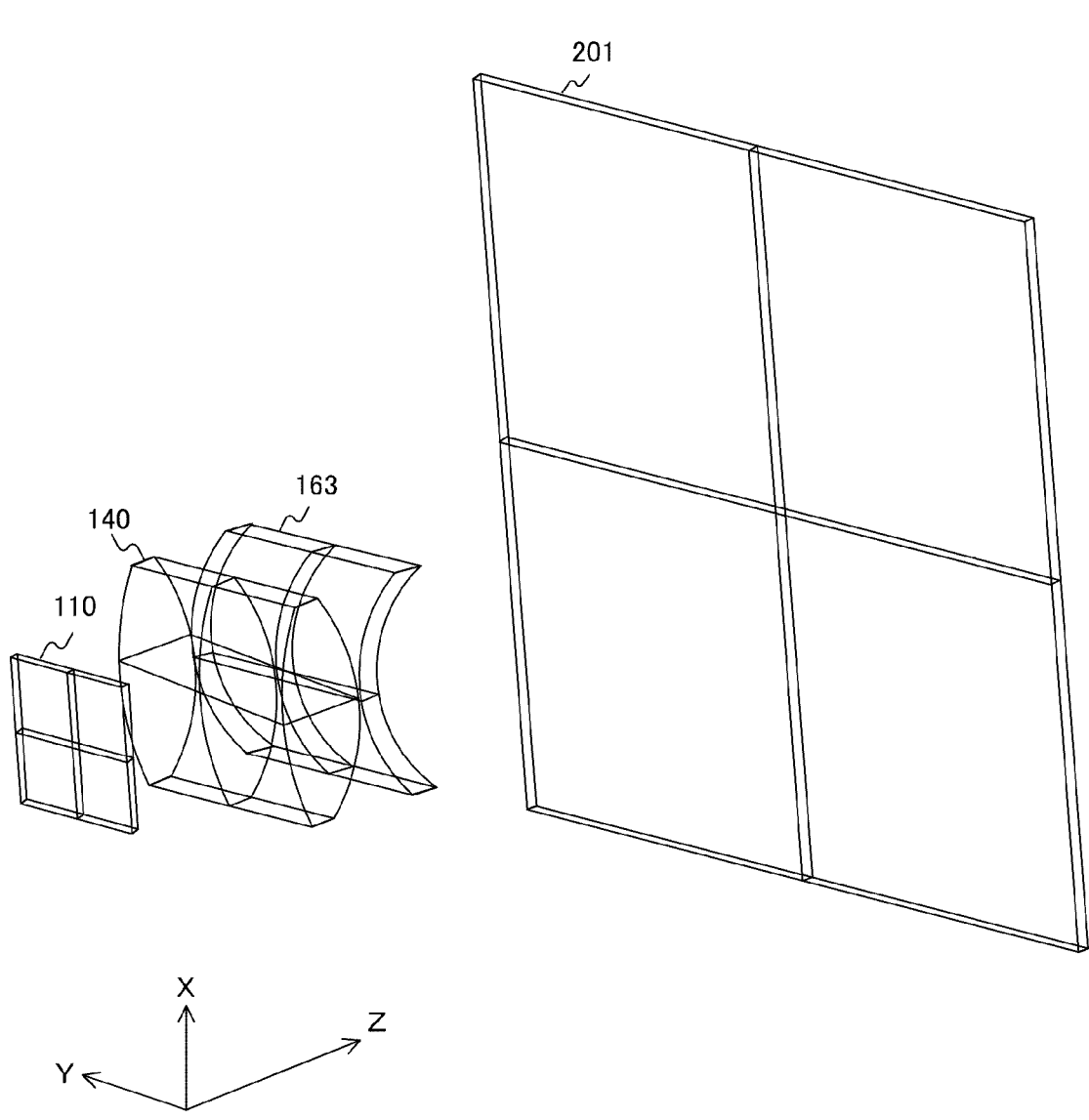
FIG. 25 is a diagram illustrating another example of the distance measuring apparatus 100 according to the sixth embodiment of the present technology.

FIG. 25 is a diagram illustrating another example of a distance measuring apparatus 100 according to the sixth embodiment of the present technology.

In this example, based on the modification example of the semiconductor laser 110 in the above-described sixth embodiment, the diffusion plate 163 is arranged on the front side of the virtual scanning center point (virtual diaphragm center point). Also in this case, a linear light beam, in which distortion does not occur, can be similarly generated.

As described above, according to the sixth embodiment of the present technology, the entire length of the optical system can be shortened by arranging the optical lens 161, the diffraction grating 162, or the diffusion plate 163 on the front side of the virtual scanning center point (virtual diaphragm center point).

7. MODIFICATION EXAMPLES

First Modification Example

Figure 26:
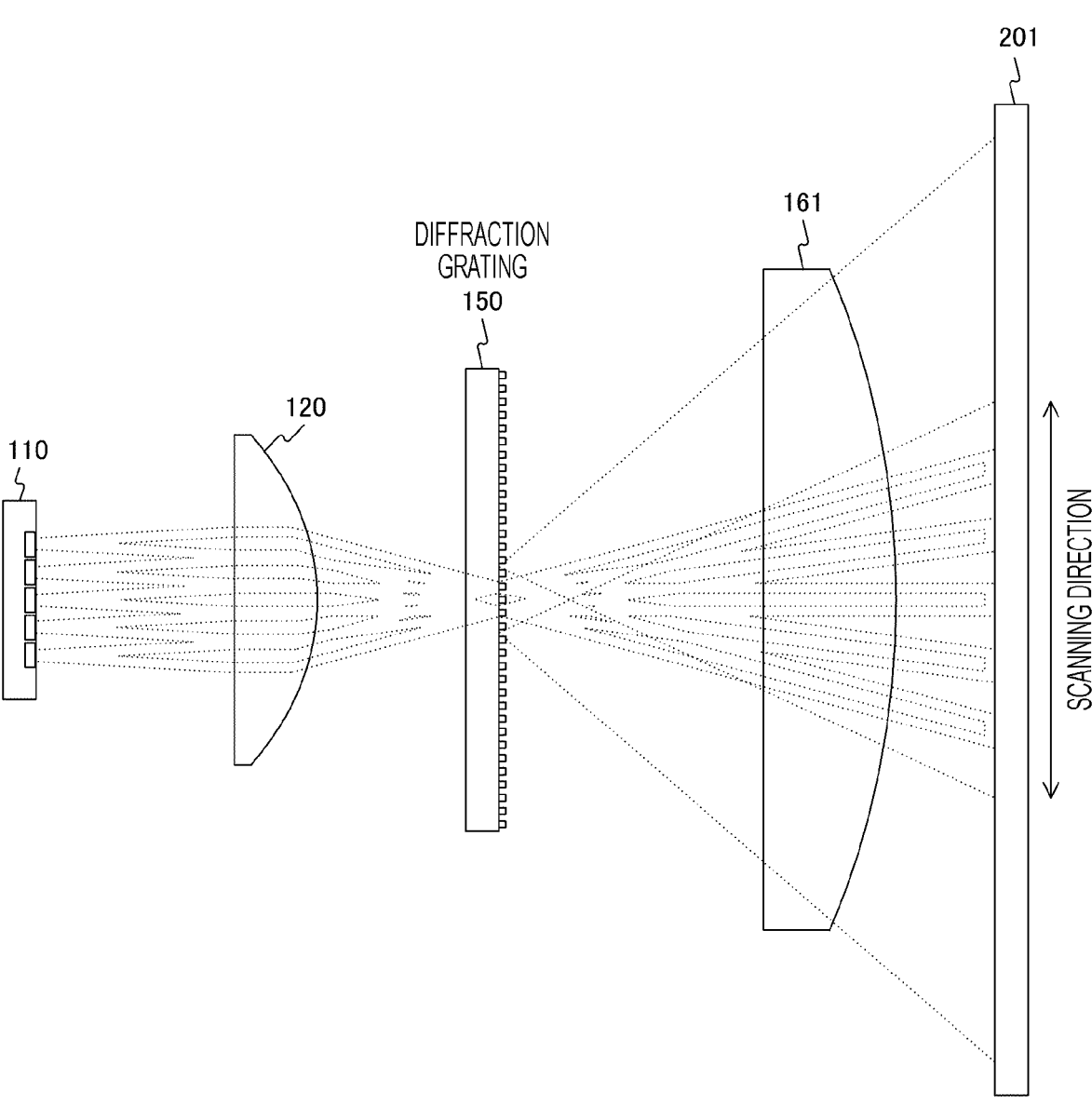
FIG. 26 is a diagram illustrating one example of a cross-sectional view of a distance measuring apparatus 100 in a first modification example of the embodiment of the present technology.

FIG. 26 is a diagram illustrating one example of a cross-sectional view of a distance measuring apparatus 100 in a first modification example of the embodiment of the present technology.

In the first modification example, based on the configuration example of the semiconductor laser 110 in the first embodiment described above, a diffraction grating 150 is provided at a diaphragm center point in an optical path to generate a duplicated pattern. This brings about an effect of widening the emission angle region. In this case, the light beam of the linear diffracted light having passed through the diffraction grating 150 is slightly distorted, but since the linear light beam of the incident 0th-order light is not distorted, it is possible to suppress the distortion of the diffracted light as compared with the conventional art.

Second Modification Example

Figure 27:
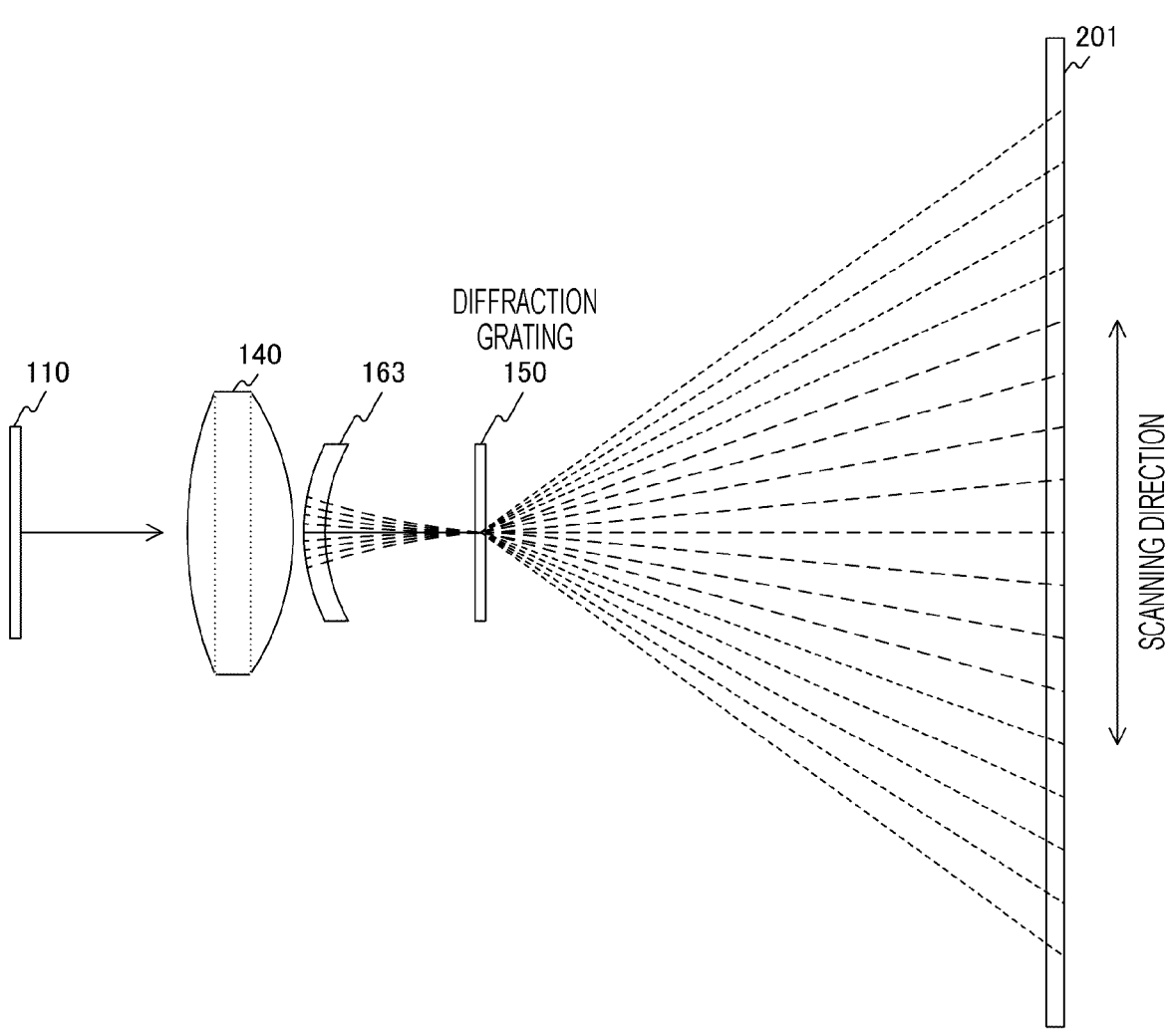
FIG. 27 is a diagram illustrating one example of a cross-sectional view of a distance measuring apparatus 100 in a second modification example of the embodiment of the present technology.

FIG. 27 is a diagram illustrating one example of a cross-sectional view of a distance measuring apparatus 100 in a second modification example of the embodiment of the present technology.

In the second modification example, based on the configuration example of the semiconductor laser 110 in the above-described sixth embodiment, the diffraction grating 150 is provided at the diaphragm center point ahead of the diffusion plate 163 to be converted into the linear light beam in the optical path, and the duplicated pattern is generated. Even in this case, the emission angle region can be expanded, and the incident linear light beam is not distorted, so that the distortion can be suppressed as compared with the conventional technology.

The above example is based on the configuration example of the semiconductor laser 110 in the first and sixth embodiments, but in other second to fifth embodiments, the diffraction grating 150 can be provided at the diaphragm center point to widen the emission angle region.

As described above, according to the embodiments of the present technology, since the generated linear light beam is not distorted, the light intensity, which is detected by the light receiving unit 181 of the line that detects the reflected light from the object corresponding to the scanning position of the light beam, is maintained high. In addition, it is possible to set the detection efficiency not depending on the position of the light receiving unit 181. Since the detection efficiency of the light receiving unit 181 is increased, the light output of the semiconductor laser 110 as the light emitting unit can be suppressed. This leads to improvement in reliability of the semiconductor laser 110 and reduction in power consumption as the distance measuring apparatus 100. This also leads to improvement of safety for eyes. In addition to the optical element for generating the linear light beam, it is unnecessary to add an optical element for correcting distortion generated there, and it is possible to reduce the size and cost of the distance measuring apparatus 100. Moreover, the trouble of optical adjustment caused by the addition of the distortion correcting optical element and the problem of deviation due to the environment do not occur.

Note that the above-described embodiments illustrate are examples for embodying the present technology, and the matters in the embodiments and the invention specifying matters in the claims each have a correspondence relationship. Similarly, the matters specifying the invention in the claims and the matters in the embodiments of the present technology denoted by the same names as the matters specifying the invention have a correspondence relationship. However, the present technology is not limited to the embodiments, and can be embodied by making various modifications to the embodiments without departing from the gist thereof.

Note that the effects described in the present specification are merely examples and are not limited, and other effects may be exerted.

Note that the present technology can also adopt the following configurations.

(1) An optical module including:

a light emitting unit including a plurality of light emitting elements arranged in a predetermined direction;

a converging unit configured to converge a light beam emitted from each of the plurality of light emitting elements into a substantially parallel light beam or a light beam having a predetermined angular width at a predetermined diaphragm center point;

a light conversion unit configured to convert the light beam via the converging unit into a linear light beam in a line direction substantially orthogonal to the arrangement direction of the light emitting unit by an optical surface; and a light detection unit configured to detect reflected light from an object with respect to the linear light beam, in which the optical surface of the light conversion unit includes a curvature radius in the arrangement direction being substantially equal to a distance from a virtual diaphragm center point in the arrangement direction to a center point of the optical surface regardless of a position in the line direction.

(2) The optical module according to (1), in which the light conversion unit generates the linear light beam by a curvature radius in the line direction.

(3) The optical module according to (2), in which the optical surface of the light conversion unit has a shape rotated about a position separated by a curvature radius of the arrangement direction from a Z position on a surface of X=0 in the optical surface along a Z axis orthogonal to an X axis indicating the arrangement direction and a Y axis indicating the line direction, with an axis parallel to the Y axis.

(4) The optical module according to claim 3, in which the optical surface satisfies the following conditional expression:

$$z=(y^2/ry)/(1+(1-(1+k) \cdot y^2/ry^2)^{1/2})$$

$$+A \cdot y^4 + B \cdot y^6 + C \cdot y^8 + \dots$$

$$+(x^2/rx)/(1+(1-x^2/rx^2)^{1/2})$$

where x, y, and z are coordinates on the X axis, the Y axis, and the Z axis, respectively, k is a conic constant, A, B, and C are fourth, sixth, and eighth aspheric coefficients, respectively, rx is a curvature radius in the arrangement direction, and ry is a curvature radius in the line direction.

(5) The optical module according to any one of (1) to (4), in which the light conversion unit is an optical lens.

(6) The optical module according to any one of (1) to (4), in which the light conversion unit is a diffraction grating having a serration-shaped grating with respect to the arrangement direction.

(7) The optical module according to any one of (1) to (4), in which the light conversion unit is a diffusion plate curved with respect to the arrangement direction.

(8) The optical module according to any one of (1) to (7), in which the light emitting unit is a surface emitting semiconductor laser in which the plurality of light emitting elements is two-dimensionally arranged.

(9) The optical module according to any one of (1) to (8), in which the light detection unit includes a plurality of light receiving units, and only one of the plurality of light receiving units that detects reflected light from an object in accordance with an arrangement position in the light emitting unit, is selectively operated.

(10) The optical module according to any one of (1) to (9), in which the converging unit includes a collimator lens.

(11) The optical module according to any one of (1) to (9), in which the converging unit includes a cylindrical lens.

(12) The optical module according to (11), in which the converging unit further includes a microcylindrical lens arranged on an upper surface closest to the light emitting unit.

(13) The optical module according to any one of (1) to (12), in which the light emitting unit has the plurality of light emitting elements arranged one-dimensionally along the arrangement direction.

(14) The optical module according to any one of (1) to (12), in which the light emitting unit has the plurality of light emitting elements arranged two-dimensionally along the arrangement direction and the line direction.

(15) The optical module according to (14), in which the light emitting unit is formed by expanding the arrangement of the two-dimensional light emitting elements outward in a barrel shape.

(16) The optical module according to any one of (1) to (15), in which the light conversion unit is arranged on a deeper side than the virtual diaphragm center point.

(17) The optical module according to any one of (1) to (15), in which the light conversion unit is arranged on a front side of the virtual diaphragm center point.

(18) The optical module according to any one of (1) to (17), further including a diffraction grating arranged at the virtual diaphragm center point.

(19) A distance measuring apparatus including:

a light emitting unit including a plurality of light emitting elements arranged in a predetermined direction;

a light irradiation unit configured to emit light emitted from each of the plurality of light emitting elements as a light beam having a predetermined angular width;

a converging unit configured to converge the emitted light beam into a substantially parallel light beam or a light beam having a predetermined angular width at a predetermined diaphragm center point;

a light conversion unit configured to convert the light beam via the converging unit into a linear light beam in a line direction substantially orthogonal to the arrangement direction of the light emitting unit by an optical surface;

a light detection unit configured to detect reflected light from an object with respect to the linear light beam; and a measuring unit configured to measure a distance to the object by counting time of flight which is a time from that light is emitted from the light irradiation unit until the light detection unit detects the reflected light, in which the light conversion unit has the optical surface having a curvature radius in the arrangement direction being substantially equal to a distance from a virtual diaphragm center point in the arrangement direction to a center point of the optical surface regardless of the position in the line direction.

REFERENCE SIGNS LIST

11 Emitted light beam
12 Reflected light beam
100 Distance measuring apparatus
110 Semiconductor laser
111 Light emitting element
120 collimator lens
130 Microcylindrical lens
140 Cylindrical lens
150 Diffraction grating
161 Optical lens
162 Diffraction grating
163 Diffusion plate
170 Converging lens
180 Photodetector
181, 182 Light receiving unit
190 Control unit
201 Object surface
202 Divided region
203 Linear beam

The invention claimed is:

1. An optical module, comprising:
a light emitting unit including a plurality of light emitting elements arranged in a predetermined direction;
a converging unit configured to converge a light beam emitted from each of the plurality of light emitting elements into a substantially parallel light beam or a light beam having a predetermined angular width at a predetermined diaphragm center point;
a light conversion unit configured to convert the light beam via the converging unit into a linear light beam in a line direction substantially orthogonal to an arrangement direction of the light emitting unit by an optical surface; and
a light detection unit configured to detect reflected light from an object with respect to the linear light beam, wherein
the optical surface of the light conversion unit includes a curvature radius in the arrangement direction being substantially equal to a distance from a virtual diaphragm center point in the arrangement direction to a center point of the optical surface regardless of a position in the line direction.

2. The optical module according to claim 1, wherein the light conversion unit generates the linear light beam by a curvature radius in the line direction.

3. The optical module according to claim 2, wherein the optical surface of the light conversion unit has a shape rotated about a position separated by a curvature radius of the arrangement direction from a Z position on a surface of X=0 in the optical surface along a Z axis orthogonal to an X axis indicating the arrangement direction and a Y axis indicating the line direction, with an axis parallel to the Y axis.

4. The optical module according to claim 3, wherein the optical surface satisfies following conditional expression:

$$z = (y^2/ry)/(1+(1-(1+k)\cdot y^2/ry^2)^{1/2})$$

$$+A\cdot y^4 + B\cdot y^6 + C\cdot y^8 + \ldots$$

$$+(x^2/rx)/(1+(1-x^2/rx^2)^{1/2})$$

where x, y, and z are coordinates on the X axis, the Y axis, and the Z axis, respectively, k is a conic constant, A, B, and C are fourth, sixth, and eighth aspheric coefficients, respectively, rx is a curvature radius in the arrangement direction, and ry is a curvature radius in the line direction.

5. The optical module according to claim 1 wherein the light conversion unit is an optical lens.

6. The optical module according to claim 1, wherein the light conversion unit is a diffraction grating having a serration-shaped grating with respect to the arrangement direction.

7. The optical module according to claim 1, wherein the light conversion unit is a diffusion plate curved with respect to the arrangement direction.

8. The optical module according to claim 1, wherein the light emitting unit is a surface emitting semiconductor laser in which the plurality of light emitting elements is two-dimensionally arranged.

9. The optical module according to claim 1, wherein the light detection unit includes a plurality of light receiving units, and only one of the plurality of light receiving units that detects reflected light from an object in accordance with an arrangement position in the light emitting unit, is selectively operated.

10. The optical module according to claim 1, wherein the converging unit includes a collimator lens.

11. The optical module according to claim 1, wherein the converging unit includes a cylindrical lens.

12. The optical module according to claim 11, wherein the converging unit further includes a microcylindrical lens arranged on an upper surface closest to the light emitting unit.

13. The optical module according to claim 1, wherein the light emitting unit has the plurality of light emitting elements arranged one-dimensionally along the arrangement direction.

14. The optical module according to claim 1, wherein the light emitting unit has the plurality of light emitting elements arranged two-dimensionally along the arrangement direction and the line direction.

15. The optical module according to claim 14, wherein the light emitting unit is formed by expanding the arrangement of the plurality of light emitting elements outward in a barrel shape.

16. The optical module according to claim 1, wherein the light conversion unit is arranged on a deeper side than the virtual diaphragm center point.

17. The optical module according to claim 1, wherein the light conversion unit is arranged on a front side of the virtual diaphragm center point.

18. The optical module according to claim 1, further comprising a diffraction grating arranged at the virtual diaphragm center point.

19. A distance measuring apparatus, comprising:

a light emitting unit including a plurality of light emitting elements arranged in a predetermined direction;

a light irradiation unit configured to emit light emitted from each of the plurality of light emitting elements as a light beam having a predetermined angular width;

a converging unit configured to converge the emitted light beam into a substantially parallel light beam or a light beam having a predetermined angular width at a predetermined diaphragm center point;

a light conversion unit configured to convert the emitted light beam via the converging unit into a linear light beam in a line direction substantially orthogonal to an arrangement direction of the light emitting unit by an optical surface;

a light detection unit configured to detect reflected light from an object with respect to the linear light beam; and a measuring unit configured to measure a distance to the object by counting time of flight which is a time from that light is emitted from the light irradiation unit until the light detection unit detects the reflected light, wherein the light conversion unit has the optical surface having a curvature radius in the arrangement direction being substantially equal to a distance from a virtual diaphragm center point in the arrangement direction to a center point of the optical surface regardless of a position in the line direction.

* * * * *